(12) United States Patent
Saito et al.

(10) Patent No.: US 11,476,413 B2
(45) Date of Patent: Oct. 18, 2022

(54) TUNNEL MAGNETORESISTANCE EFFECT DEVICE AND MAGNETIC DEVICE USING SAME

(71) Applicant: Alps Alpine Co., Ltd., Tokyo (JP)

(72) Inventors: Masamichi Saito, Miyagi-ken (JP); Fumihito Koike, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 203 days.

(21) Appl. No.: 16/909,656

(22) Filed: Jun. 23, 2020

(65) Prior Publication Data

US 2020/0328344 A1    Oct. 15, 2020

Related U.S. Application Data

(63) Continuation of application No. PCT/JP2018/046842, filed on Dec. 19, 2018.

(30) Foreign Application Priority Data

Dec. 26, 2017    (JP) .............................. JP2017-249084

(51) Int. Cl.
*H01L 43/08*    (2006.01)
*G01R 33/09*    (2006.01)
(Continued)

(52) U.S. Cl.
CPC ............ *H01L 43/08* (2013.01); *G01R 33/093* (2013.01); *G01R 33/098* (2013.01);
(Continued)

(58) Field of Classification Search
CPC ......... H01L 43/08; H01L 43/02; H01L 43/10; G11C 11/161; G11B 5/3909; H01F 10/3268; G01R 33/093; G01R 33/098
(Continued)

(56) References Cited

U.S. PATENT DOCUMENTS

| 7,023,670 B2 | 4/2006 | Saito |
| 7,564,661 B2 * | 7/2009 | Ide .................. H01F 41/302 360/324.12 |

(Continued)

FOREIGN PATENT DOCUMENTS

| JP | 2002-303536 | 10/2002 |
| JP | 2003-338644 | 11/2003 |

(Continued)

OTHER PUBLICATIONS

International Search Report from corresponding International Application No. PCT/JP2018/046842, 3pgs, dated Mar. 5, 2019.
(Continued)

*Primary Examiner* — Jami Valentine Miller
(74) *Attorney, Agent, or Firm* — Crowell & Moring LLP

(57) ABSTRACT

A tunnel magnetoresistance effect (TMR) device includes an exchange coupling film having a first ferromagnetic layer, which is at least a portion of a fixed magnetic layer, and an antiferromagnetic layer laminated on the first ferromagnetic layer. The ferromagnetic layer includes an X(Cr—Mn) layer containing one or two or more elements X selected from the group consisting of the platinum group elements and Ni, and also containing Mn and Cr. The X(Cr—Mn) layer has a first region relatively near the first ferromagnetic layer, and a second region relatively far away from the first ferromagnetic layer, and the content of Mn in the first region is higher than that in the second region.

21 Claims, 14 Drawing Sheets

(51) Int. Cl.
  *G11B 5/39* (2006.01)
  *G11C 11/16* (2006.01)
  *H01F 10/32* (2006.01)
  *H01L 43/02* (2006.01)
  *H01L 43/10* (2006.01)

(52) U.S. Cl.
  CPC .......... *G11B 5/3909* (2013.01); *G11C 11/161* (2013.01); *H01F 10/3268* (2013.01); *H01L 43/02* (2013.01); *H01L 43/10* (2013.01)

(58) Field of Classification Search
  USPC ........................................................ 257/421
  See application file for complete search history.

(56) References Cited

U.S. PATENT DOCUMENTS

| | | | | |
|---|---|---|---|---|
| 7,567,413 | B2* | 7/2009 | Ide .................... | H01F 10/1936 360/324.11 |
| 7,691,215 | B2* | 4/2010 | Felser ................ | H01L 43/10 420/583 |
| 8,125,745 | B2* | 2/2012 | Inomata ............. | G11B 5/3909 360/324.1 |
| 8,329,478 | B2* | 12/2012 | Shi .................... | G11C 11/161 438/3 |
| 8,786,280 | B2 | 7/2014 | Yamazaki et al. | |
| 11,249,151 | B2* | 2/2022 | Saito ................. | G01R 33/0023 |
| 11,269,450 | B2* | 3/2022 | Sasai ................. | G06F 3/04166 |
| 2002/0159202 | A1* | 10/2002 | Yanagiuchi .......... | B82Y 10/00 |
| 2003/0017364 | A1* | 1/2003 | Kikitsu .............. | B82Y 25/00 428/828 |
| 2003/0103299 | A1* | 6/2003 | Saito ................. | G01R 33/093 |
| 2014/0077319 | A1* | 3/2014 | Noma ................ | H01L 43/02 257/421 |
| 2019/0312198 | A1* | 10/2019 | Sun .................. | H01L 43/08 |
| 2021/0382122 | A1* | 12/2021 | Saito ................. | H01L 43/08 |
| 2021/0388493 | A1* | 12/2021 | Sorita ............... | C23C 16/54 |

FOREIGN PATENT DOCUMENTS

| | | |
|---|---|---|
| JP | 2003-338644 A | 11/2003 |
| JP | 2009-004692 | 1/2009 |
| JP | 2009-004692 A | 1/2009 |
| JP | 2011-47930 | 3/2011 |

OTHER PUBLICATIONS

Notice of Reasons for Refusal from corresponding Japanese Patent Application No. 2019-561583, dated Jun. 1, 2021, 7pp.

* cited by examiner

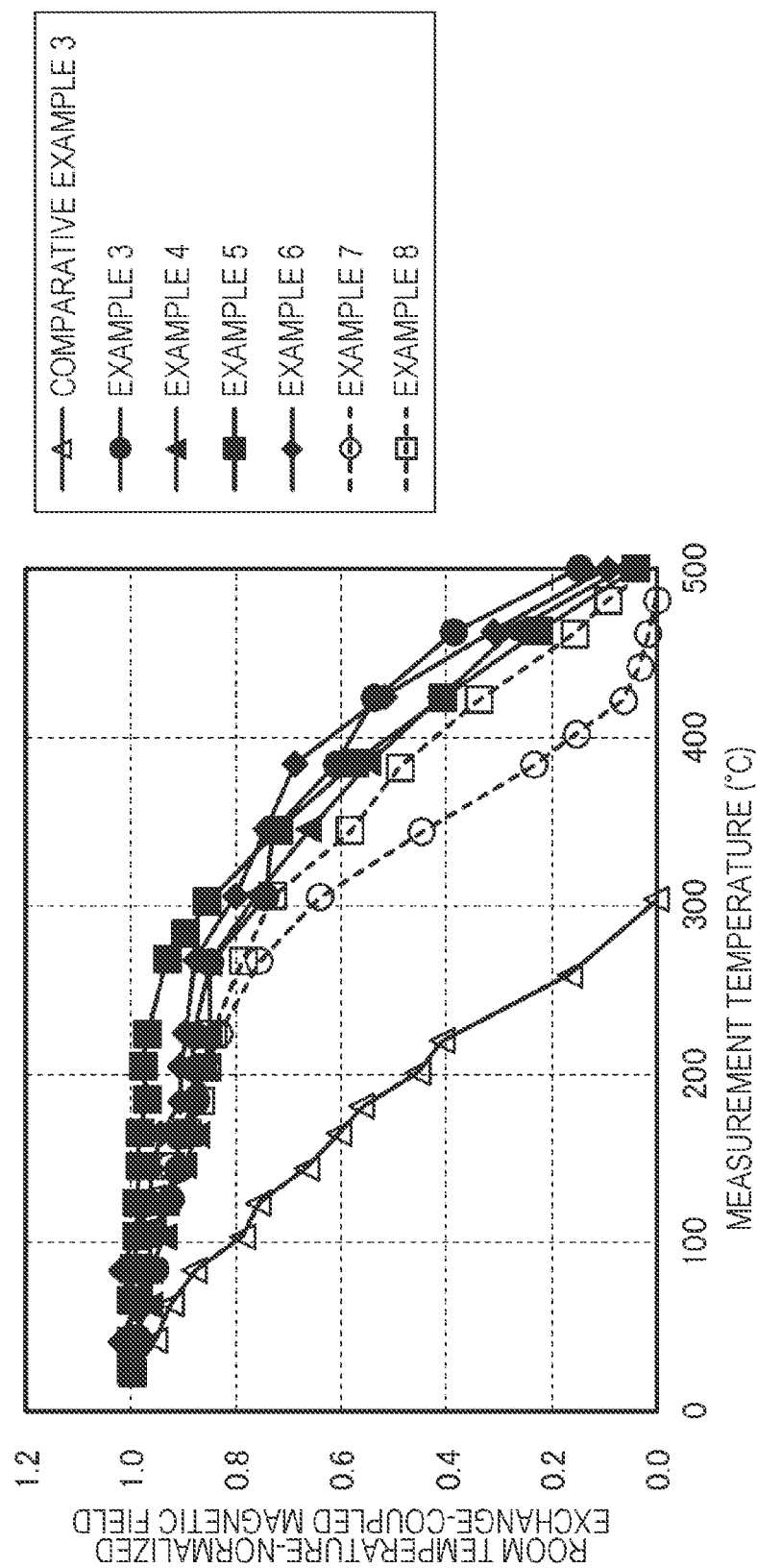

TUNNEL MAGNETORESISTANCE EFFECT DEVICE AND MAGNETIC DEVICE USING SAME

CLAIM OF PRIORITY

This application is a Continuation of International Application No. PCT/JP2018/046842 filed on Dec. 19, 2018, which claims benefit of priority to Japanese Patent Application No. 2017-249084 filed on Dec. 26, 2017. The entire contents of each application noted above are hereby incorporated by reference.

BACKGROUND

1. Field of the Disclosure

The present disclosure relates to a tunnel magnetoresistance effect device and a magnetic device using the same.

2. Description of the Related Art

A tunnel magnetoresistance effect (TMR) device having a structure in which a fixed magnetic layer and a free magnetic layer are laminated through an insulating barrier layer has a higher magnetoresistance ratio (MR ratio) than that of a giant magnetoresistance effect (GMR) device. Thus, a TMR is thus used for various magnetic devices such as a magnetic head, a magnetic memory, a magnetic sensor, and the like (refer to, for example, Japanese Unexamined Patent Application Publication No. 2009-4692).

When these magnetic devices are used for various apparatuses, the devices are required to properly operate even in severe environments such as a high-temperature environment, a high-magnetic-field environment, and the like.

SUMMARY

The present disclosure provides a tunnel magnetoresistance effect (TMR) device which can be properly operated even in a high-temperature environment, a high-magnetic-field environment, and the like, and also provides a magnetic device including the TMR device.

In one aspect, a tunnel magnetoresistance effect device has a structure in which a fixed magnetic layer having a ferromagnetic layer and a free magnetic layer are laminated through an insulating barrier layer. The ferromagnetic layer and an antiferromagnetic layer laminated on the ferromagnetic layer constitute an exchange coupling film, and the antiferromagnetic layer includes an X(Cr—Mn) layer containing one or two or more elements X selected from the group consisting of the platinum group elements and Ni, and also containing Mn and Cr. The X(Cr—Mn) is a magnetic field application bias film having a first region relatively near the ferromagnetic layer and a second region relatively far away from the ferromagnetic layer, the content of Mn in the first region being higher than that in the second region.

In a specific aspect of the exchange coupling film of the tunnel magnetoresistance effect device, the antiferromagnetic layer may be formed by laminating a PtCr layer and a $X^0$Mn Layer (wherein $X^0$ is one or two or more elements selected from the group consisting of the platinum group elements and Ni) nearer to the ferromagnetic layer than the PtCr layer.

In another aspect, a tunnel magnetoresistance effect device has a structure in which a fixed magnetic layer having a ferromagnetic layer and a free magnetic layer are laminated through an insulating barrier layer. The ferromagnetic layer and an antiferromagnetic layer laminated on the ferromagnetic layer constitute an exchange coupling film, and the antiferromagnetic layer has an alternately laminated structure of three or more layers in which an $X^1$Cr layer (wherein $X^1$ is one or two or more elements selected from the group consisting of the platinum group elements and Ni) and an $X^2$Mn layer (wherein $X^2$ is one or two or more elements selected from the group consisting of the platinum group elements and Ni and may be the same as or different from $X^1$) are alternately laminated.

In a still another aspect, a magnetic device includes the tunnel magnetoresistance effect device. Examples of the magnetic device include a magnetic head having the tunnel magnetoresistance effect device as a reading device, a magnetic memory having the tunnel magnetoresistance effect device as a recording device, and a magnetic sensor having the tunnel magnetoresistance effect device as a detection device. These magnetic devices can be used even in severe environments because the tunnel magnetoresistance effect device has excellent stability in a high-temperature environment and has strong-magnetic field resistance.

In a further aspect, an apparatus includes the magnetic detection device. Examples of the apparatus include an electronic apparatus, a transport apparatus, a telecommunication apparatus, a medical apparatus, production instrument, an infrastructure apparatus, and the like.

According to the present invention, a tunnel magnetoresistance effect device having excellent strong-magnetic field resistance even in a high-temperature environment is provided. Therefore, the use of the tunnel magnetoresistance effect device of the present invention can provide a magnetic derive which is stable even when a strong magnetic field is applied in a high-temperature environment, and enables mounting on various apparatuses.

BRIEF DESCRIPTION OF THE DRAWINGS

FIG. 14 is a graph showing the temperature dependence of the strength of exchange-coupled magnetic field Hex.

DESCRIPTION OF THE EXEMPLARY EMBODIMENTS

Figure 1:
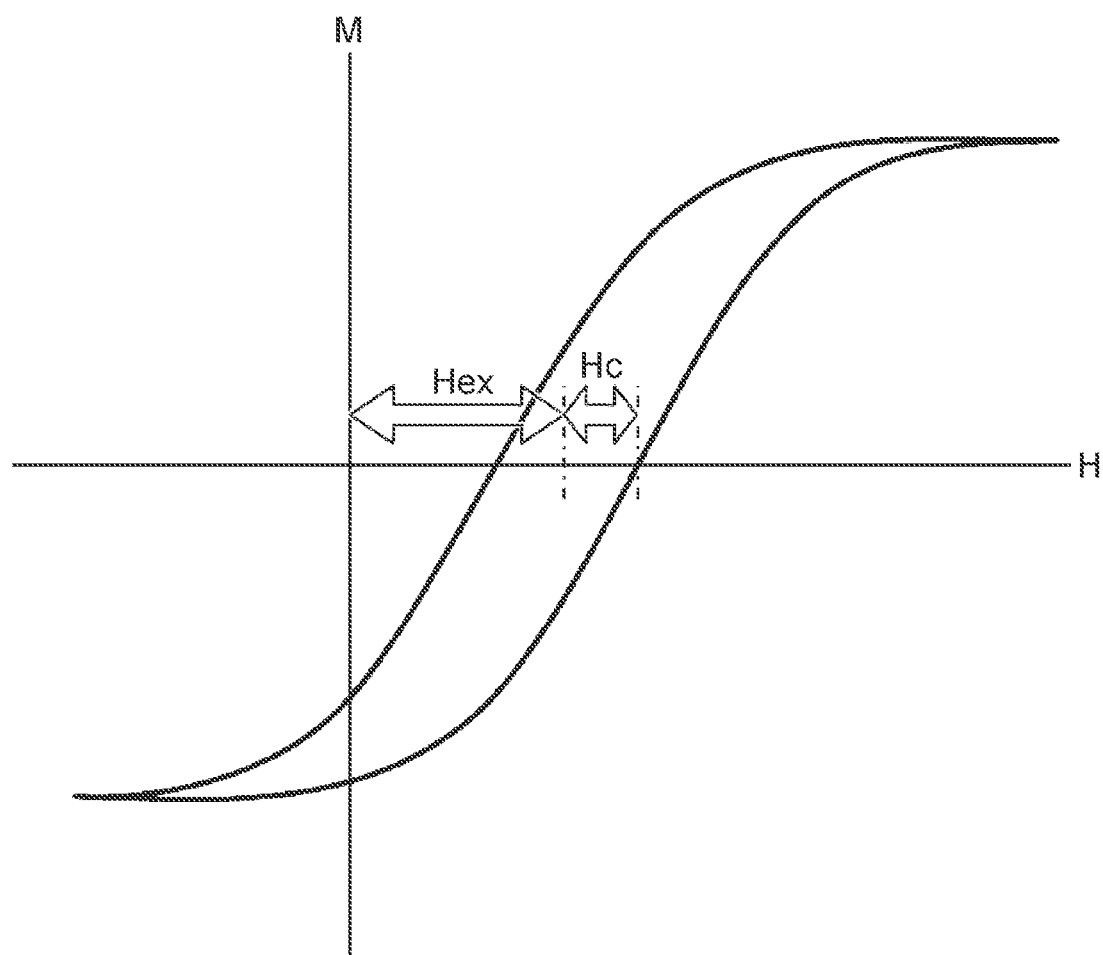
FIG. 1 is a graph illustrating a hysteresis loop of the magnetization curve of a magnetic field application bias film according to the present invention.

FIG. 1 is a graph illustrating a hysteresis loop of the magnetization curve of an exchange coupling film according to the present invention. In general, a hysteresis loop formed by the M-H curve (magnetization curve) of a soft magnetic material has a symmetrical shape with intersection (magnetic field H=0 A/m, magnetization M=0 A/m) of the H axis and the M axis as a center. However, as shown in FIG. 1, the hysteresis loop of the exchange coupling film according to the present invention has a shape shifted along the H axis according to the magnitude of exchange-coupled magnetic field Hex because the exchange-coupled magnetic field Hex exerts on the ferromagnetic layer exchange-coupled with the antiferromagnetic layer. With the higher exchange-coupled magnetic field Hex, the magnetization direction of the ferromagnetic layer of the exchange coupling film is hardly reversed even when an external magnetic field is applied. Thus, a tunnel magnetoresistance effect device including, as at least a portion of a fixed magnetic layer, a ferromagnetic layer of an exchange coupling film is allowed to have good strong-magnetic field resistance.

In the case where the coercive force Hc defined by a difference between the center (the magnetic field strength at the center corresponds to the exchange-coupled magnetic field Hex) of the hysteresis loop shifted along the H axis and the H-axis intercept of the hysteresis loop is smaller than the exchange-coupled magnetic field Hex, even when the fixed magnetic layer of the exchange coupling film is magnetized along the external magnetic field applied, the magnetization direction of the ferromagnetic layer can be arranged by the exchange-coupled magnetic field Hex relatively stronger than the coercive force Hc when application of the external magnetic field is terminated. That is, when the exchange-coupled magnetic field Hex and the coercive force Hc have the relationship Hex>Hc, the tunnel magnetoresistance effect device including the fixed magnetic layer having the exchange coupling film has good strong-magnetic field resistance.

In addition, the ferromagnetic layer provided in the exchange coupling film has a higher blocking temperature Tb than that of an antiferromagnetic film formed by a usual antiferromagnetic material such as IrMn, PtMn, or the like and thus can maintain the exchange-coupled magnetic field Hex, for example, even when placed in an environment of about 300° C. with the strong magnetic field applied. Therefore, the tunnel magnetoresistance effect device including the fixed magnetic layer having the exchange coupling film has excellent stability in a high-temperature environment and has strong-magnetic field resistance.

Figure 2:
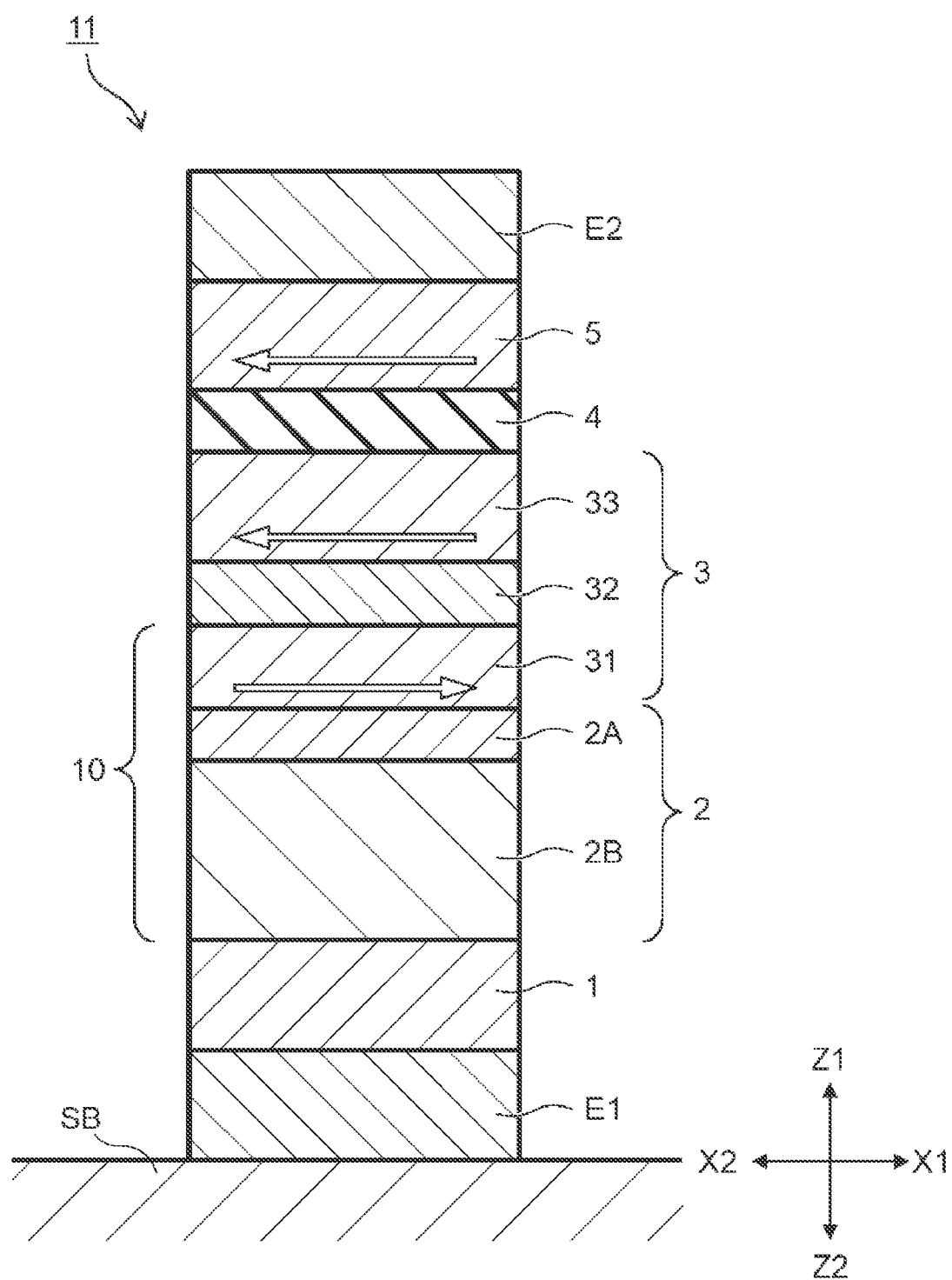
FIG. 2 is an explanatory drawing showing the configuration of a tunnel magnetoresistance effect device according to a first embodiment of the present invention.

FIG. 2 is an explanatory drawing schematically showing the structure of a tunnel magnetoresistance effect (TMR) device according to a first embodiment of the present invention.

As shown in FIG. 2, a tunnel magnetoresistance effect device (TMR device) 11 is provided between a lower electrode E1 formed on a substrate SB and an upper electrode E2. The substrate SB is, for example, composed of a Si substrate having an alumina-laminated surface. The lower electrode E1 is composed of, for example, a laminate of Cu and Ta. The upper electrode E2 is composed of, for example, a laminate of Ru and Ta.

The TMR device 11 is configured by laminating, on the lower electrode E1 formed on the alumina-laminated surface of the substrate SB, a seed layer 1, an antiferromagnetic layer 2, a fixed magnetic layer 3, an insulating barrier layer 4, and a free magnetic layer 5 in order from below. That is, the TMR device 11 has a structure in which the fixed magnetic layer 3 having a ferromagnetic layer and the free magnetic layer 5 are laminated through the insulating barrier layer 4. The antiferromagnetic layer 2 and a first ferromagnetic layer 31, which is a portion of the fixed magnetic layer 3, constitute an exchange coupling film 10. The upper electrode E2 is formed on the TMR device 11.

The seed layer 1 is used for arranging the crystal orientation of each of the layers formed thereon and is formed of Ru, Ni—Fe—Cr, or the like.

The antiferromagnetic layer 2 includes a PtMn layer 2A and a PtCr layer 2B, which are laminated in this order from the side near the first ferromagnetic layer 31. Each of the layers is formed by, for example, a sputtering process or a CVD process. In forming an alloy layer such as the PtMn layer 2A, a plurality of metals (in the case of the PtMn layer 2A, Pt and Mn) which form an alloy may be simultaneously supplied or a plurality of metals forming an alloy may be alternately supplied. An example of the former case is simultaneous sputtering of a plurality of metals forming an alloy, and example of the latter case is alternate lamination of a plurality of different metal films. The simultaneous supply of a plurality of metals forming an alloy may be preferred for increasing the exchange-coupled magnetic field Hex as compared with the alternate supply.

After deposition, the antiferromagnetic layer 2 is regularized by annealing and is exchange-coupled with the first ferromagnetic layer 31, thereby producing the exchange-coupled magnetic field Hex in the first ferromagnetic layer 31. The blocking temperature Tb of the antiferromagnetic layer 2 is higher than the blocking temperatures Tb of an antiferromagnetic layer composed of IrMn and of an antiferromagnetic layer composed of PtMn according to related art, and thus the exchange coupling film 10 can maintain the exchange-coupled magnetic field Hex high even in a high-temperature environment. The annealing causes mutual diffusion of the atoms in each of the layers constituting the antiferromagnetic layer 2.

The antiferromagnetic layer 2 provided in the exchange coupling film 10 according to the present embodiment has an X(Cr—Mn) layer containing one or two or more elements X selected from the group consisting of the platinum group elements and Ni, and also containing Mn and Cr. The antiferromagnetic layer 2 formed by the laminated structure shown in FIG. 2 contains Pt as the element X and is thus a Pt(Cr—Mn) layer. The Pt(Cr—Mn) layer has a first region relatively near the first ferromagnetic layer 31, and a second region relatively far from the first ferromagnetic layer 31, and the content of Mn in the first region is higher than that in the second region. The Pt(Cr—Mn) layer having the structure is formed by annealing the PtMn layer 2A and the PtCr layer 2B which are laminated. A content distribution (depth profile) of each of the constituent elements in the depth direction can be obtained by surface analysis during sputtering.

Figure 3:
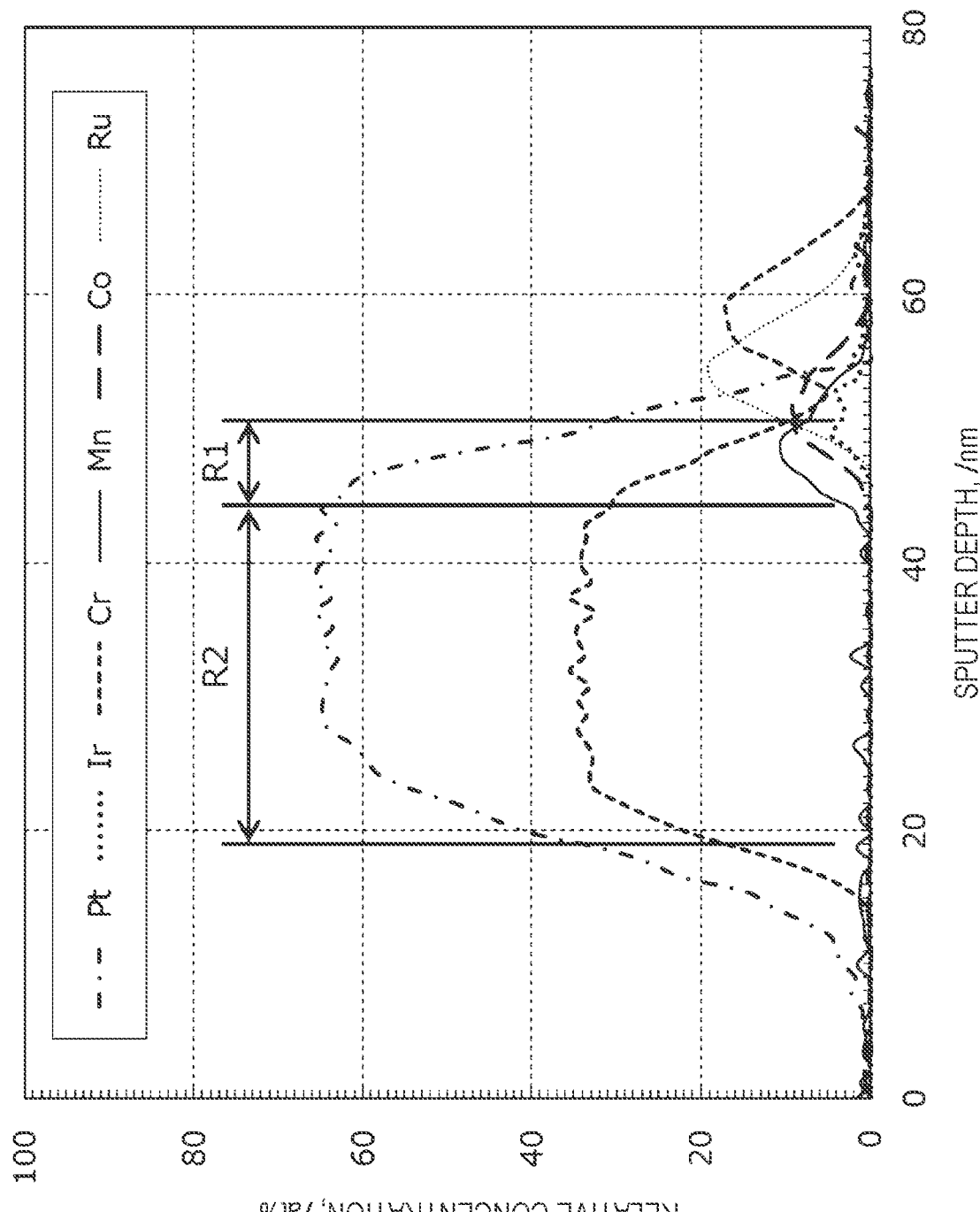
FIG. 3 is an example of a depth profile.

FIG. 3 is an example of the depth profile of a laminate containing an exchange coupling film having the same configuration as the exchange coupling film 10 according to the present embodiment. The exchange coupling film in the laminate includes a fixed magnetic layer and an antiferromagnetic layer. The depth profile shown in FIG. 3 is obtained from a film formed by annealing a film with a configuration below at 350° C. for 20 hours in a magnetic field of 15 kOe. A numerical value in parenthesis indicates the thickness (Å).

Substrate/underlaying layer: NiFeCr (40)/nonmagneic material layer: [Cu (40)/Ru (20)]/fixed magnetic layer: $Co_{40at\%}Fe_{60at\%}$ (20)/antiferromagnetic layer [IrMn layer: $Ir_{22at\%}Mn_{78at\%}$ (10)/PtMn layer: $Pt_{50at\%}Mn_{50at\%}$ (16)/PtCr layer: $Pt_{51at\%}Cr_{49at\%}$ (300)]/protective layer: Ta (100)

Specifically, the depth profile shown in FIG. 3 includes the content distribution of each of Pt, Ir, Cr, and Mn in the depth direction, which is obtained by surface analysis with an Auger electron spectrometer during argon sputtering from the protective layer side. The argon sputtering rate is 1.1 nm/min determined in terms of $SiO_2$.

Figure 4:
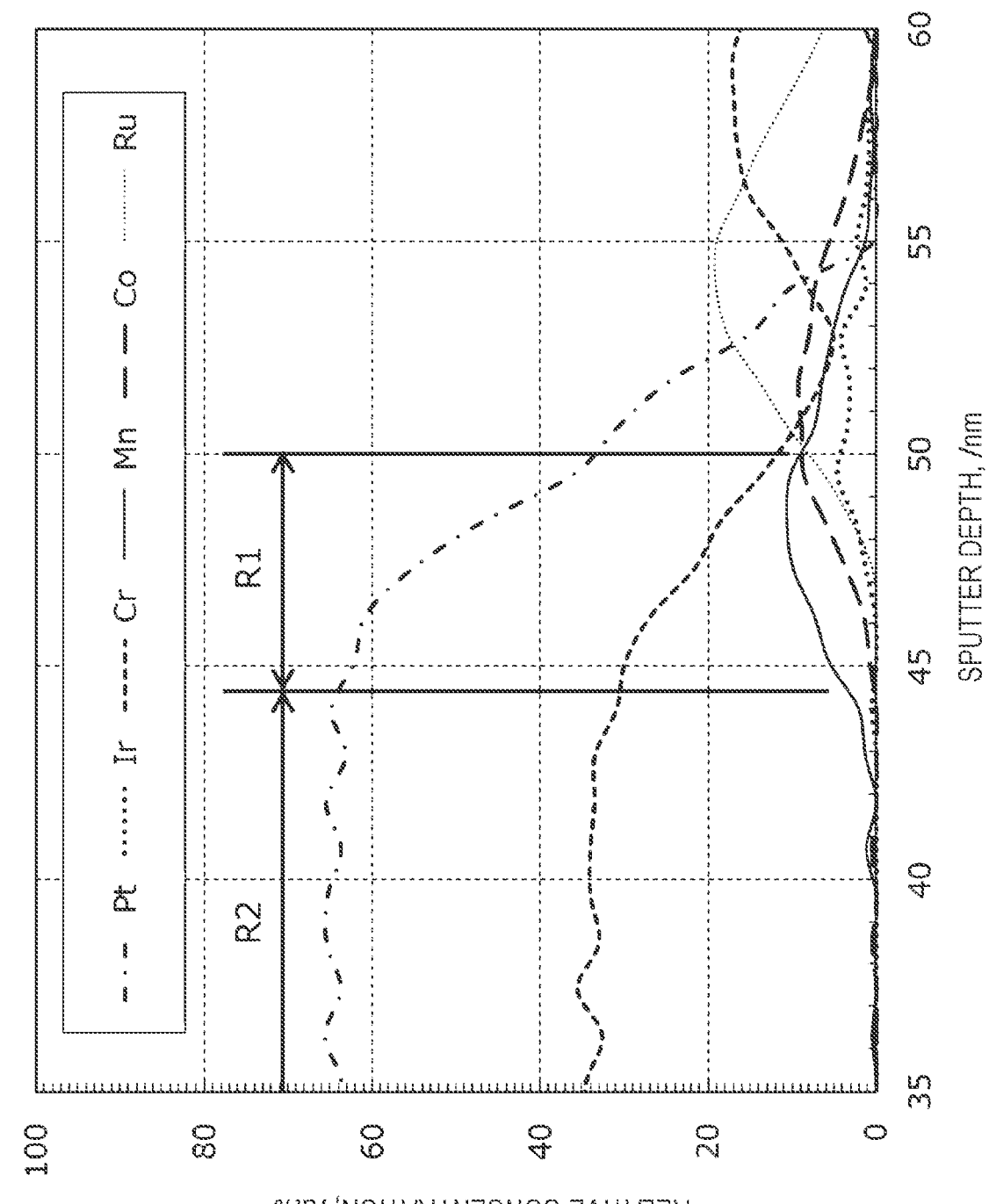
FIG. 4 is a profile showing an enlargement of a portion of the depth profile in FIG. 3.

FIG. 4 is an enlargement of a portion shown in FIG. 3. In both FIG. 3 and FIG. 4, in order to confirm the depth position of the fixed magnetic layer and the nonmagnetic material layer, the depth profile contains the Co (one of the constituent elements of the fixed magnetic layer) content distribution and the Ru (one of the constituent elements on the antiferromagnetic layer side of the nonmagnetic material layer) content distribution.

As shown in FIG. 3, the antiferromagnetic layer has a thickness of about 30 nm and includes an X(Cr—Mn) layer, specifically a (Pt—Ir) (Cr—Mn) layer, containing Pt and Ir as one or two or more elements X selected from the group consisting of the platinum group elements and Ni, and also containing Mn and Cr. The X(Cr—Mn) layer ((Pt—Ir) (Cr—Mn) layer) has a first region R1 relatively near the fixed magnetic layer, and a second region R2 relatively far from the fixed magnetic layer, and the content of Mn in the first region R1 is higher than that in the second region R2. This structure can be obtained by properly laminating a layer composed of XCr and a layer composed of XMn to form a multilayer laminate and annealing the resultant laminate as described above.

Figure 5:
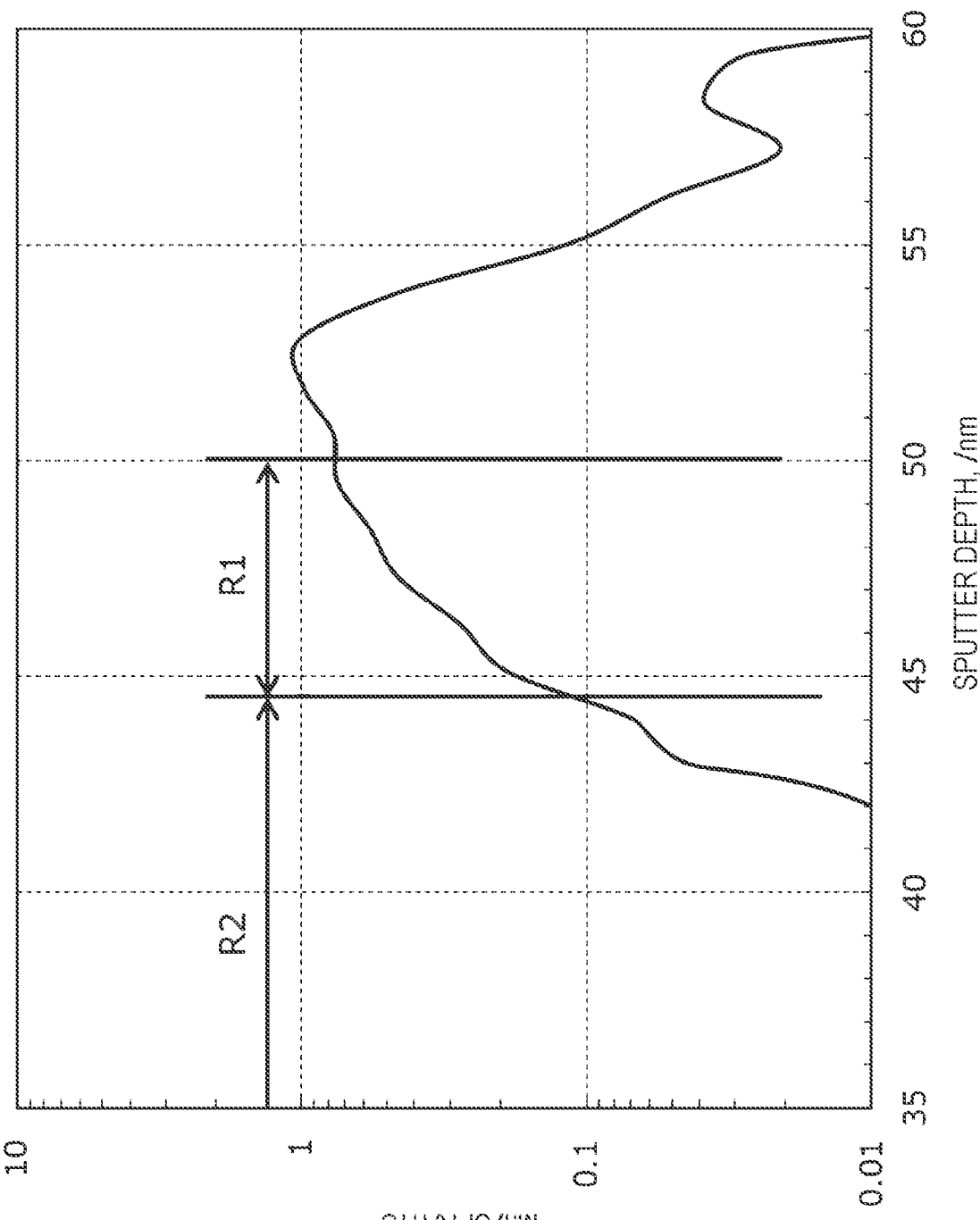
FIG. 5 is a graph showing the ratio (Mn/Cr ratio) of Cr content to Mn content determined based on FIG. 4 within the same abscissa range as in FIG. 4.

FIG. 5 is a graph showing the ratio (Mn/Cr ratio) of the Mn content to the Cr content calculated based on the Mn content and the Cr content at each depth, determined by the depth profile, within the same abscissa range as in FIG. 4. In the present specification, based on the results shown in FIG. 5, the depth with the Mn/Cr ratio of 0.1 is regarded as the boundary between the first region R1 and the second region R2. That is, in the antiferromagnetic layer, the region being nearer to the fixed magnetic layer and having the Mn/Cr ratio of 0.1 or more is defined as the first region R1, and the region other than the first region R1 in the antiferromagnetic layer is defined as the second region R2. Based on this definition, the boundary between the first region R1 and the second region R2 is located at the depth of about 44.5 nm in the depth profile shown in FIG. 3.

Not only the large Mn/Cr ratio influences the magnitude of the exchange-coupled magnetic field Hex, but also the larger the Mn/Cr ratio is, the more easily the Hex/Hc value is made positive and the absolute value thereof is increased. Specifically, the first region R1 preferably has a portion having the Mn/Cr ratio of 0.3 or more, more preferably has a portion having the Mn/Cr ratio of 0.7 or more, and particularly preferably has a portion having the Mn/Cr ratio of 1 or more.

Therefore, the first region R1 contains relatively much Mn, and thus the exchange coupling film 10 can generate the high exchange-coupled magnetic field Hex. On the other hand, the second region R2 has a low Mn content and a relatively high Cr content, and thus the antiferromagnetic layer 2 has the high blocking temperature Tb. Therefore, the exchange coupling film 10 can maintain the high exchange-coupled magnetic field Hex even when placed in a high-temperature environment. Although, in the above description, the layer laminated on the ferromagnetic layer side of the PtCr layer is the PtMn layer, the structure is not limited to this. An $X^0$Mn Layer (wherein $X^0$ is one or two or more elements selected from the group consisting of the platinum group elements and Ni) may be laminated nearer to the ferromagnetic layer than the PtCr layer.

As shown in FIG. 2, the fixed magnetic layer 3 has a laminated ferristructure in which the first ferromagnetic layer 31, a nonmagnetic intermediate layer 32, and a second ferromagnetic layer 33 are laminated in order from below. As described above, the magnetization of the first ferromagnetic layer 31 is fixed in a direction (in FIG. 2, the direction toward the X1 side in the X1-X2 direction) by the exchange-coupled magnetic field (Hex) produced between the first ferromagnetic layer 31 and the antiferromagnetic layer 2 and by the RKKY interaction produced between the first ferromagnetic layer 31 and the second ferromagnetic layer 33. On the other hand, the magnetization of the second ferromagnetic layer 33 is fixed in the direction (in FIG. 2, the direction toward the X2 side in the X1-X2 direction) opposite to the magnetization direction of the first ferromagnetic layer 31. The first ferromagnetic layer 31 is formed of a ferromagnetic material, for example, a CoFe alloy (cobalt-iron alloy). The coercive force Hc of the CoFe alloy is increased by increasing the Fe content ratio. The thickness of the first ferromagnetic layer 31 may be preferably 12 Å or more and 30 Å or less. The nonmagnetic intermediate layer 32 is formed of, for example, Ru. The second ferromagnetic layer 33 is formed by, for example, a laminated structure of a Co—Fe layer, a Co—Fe—B layer, and a Co—Fe layer.

The insulating barrier layer 4 is formed of Mg—O. The composition ratio of Mg is preferably within a range of 40 at % or more and 60 at % or less, and $Mg_{50at\%}O_{50at\%}$ is more preferred.

The free magnetic layer 5 is formed by, for example, a laminated structure of a Co—Fe layer and a Co—Fe—B layer. The magnetization direction of the free magnetic layer 5 is not fixed, and magnetization is variable in the X-Y plane according to an external magnetic field. FIG. 2 shows a state where without the external magnetic field applied, the magnetization direction of the free magnetic layer 5 is aligned to the magnetization direction (direction toward the X2 side in the X1-X2 direction) of the second ferromagnetic layer 33. In this state, the resistance between the lower electrode E1 and the upper electrode E2 is minimized. While in a state where the magnetization direction of the free magnetic layer 5 is antiparallel (direction toward the X1 side in the X1-X2 direction) to the magnetization direction of the second ferromagnetic layer 33, the resistance between the lower electrode E1 and the upper electrode E2 is maximized.

Figure 6:
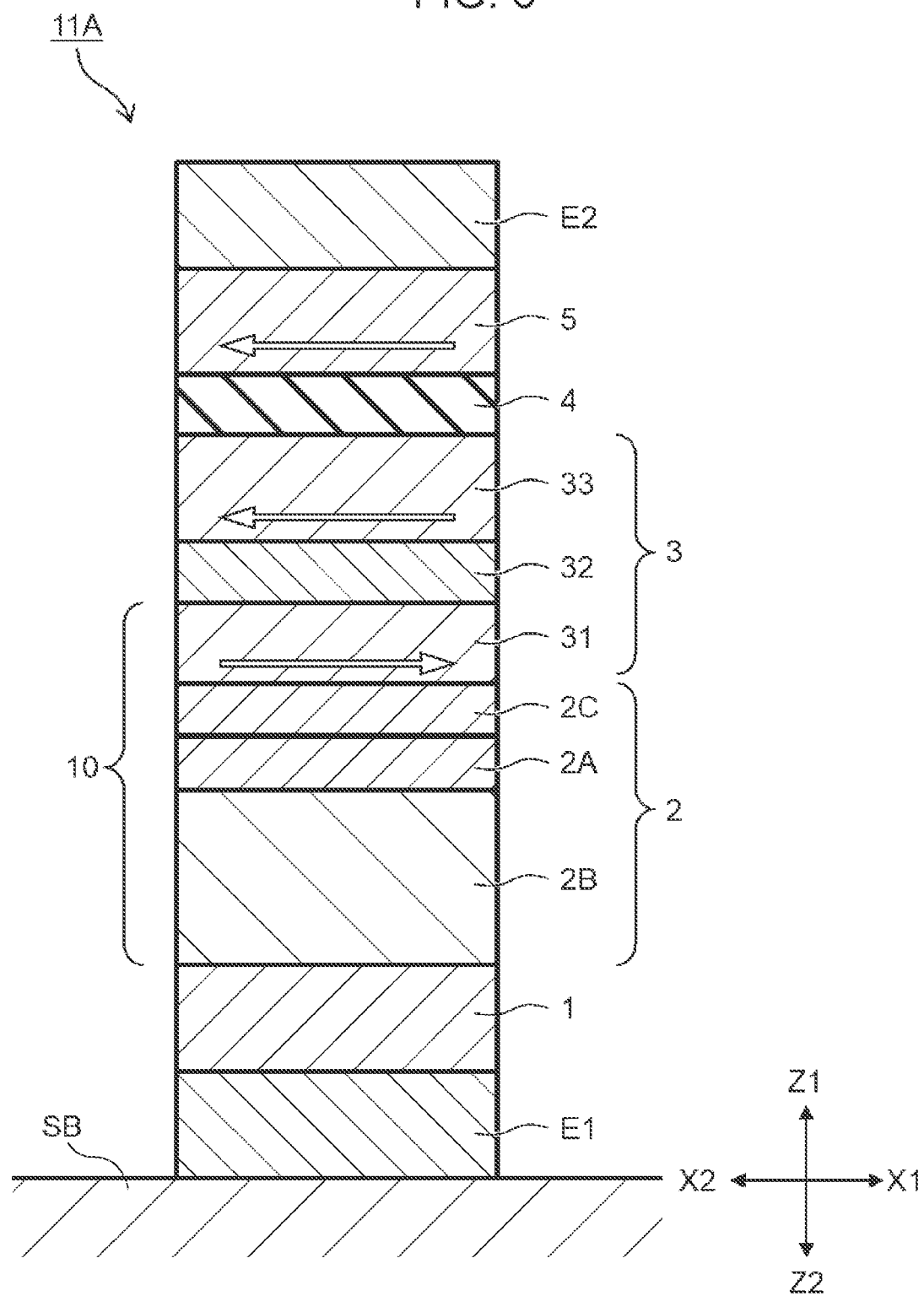
FIG. 6 is an explanatory drawing showing the configuration of a tunnel magnetoresistance effect device according to a first modified example (the configuration in which the antiferromagnetic layer further includes an IrMn layer) of the first embodiment of the present invention.

The layer configuration and materials of the TMR device 11 described above are an example. For example, as in a TMR derive 11A shown in FIG. 6, the antiferromagnetic layer 2 may include an IrMn layer 2C, a PtMn layer 2A, and a PtCr layer 2B, which are laminated from the side near the first ferromagnetic layer 31. The TMR device 11 is the so-called bottom type in which the antiferromagnetic layer 2, the fixed magnetic layer 3, the insulating barrier layer 4, and the free magnetic layer 5 are laminated in order from below as viewed from the substrate SB and the lower electrode E1 formed on the substrate SB. However, as in a TMR device 11B shown in FIG. 7, the so-called top type may be formed by laminating the free magnetic layer 5, the insulating barrier layer 4, the fixed magnetic layer 3, and the antiferromagnetic layer 2 in order from below as viewed from the substrate SB and the lower electrode E1 formed on the substrate SB.

Figure 8:
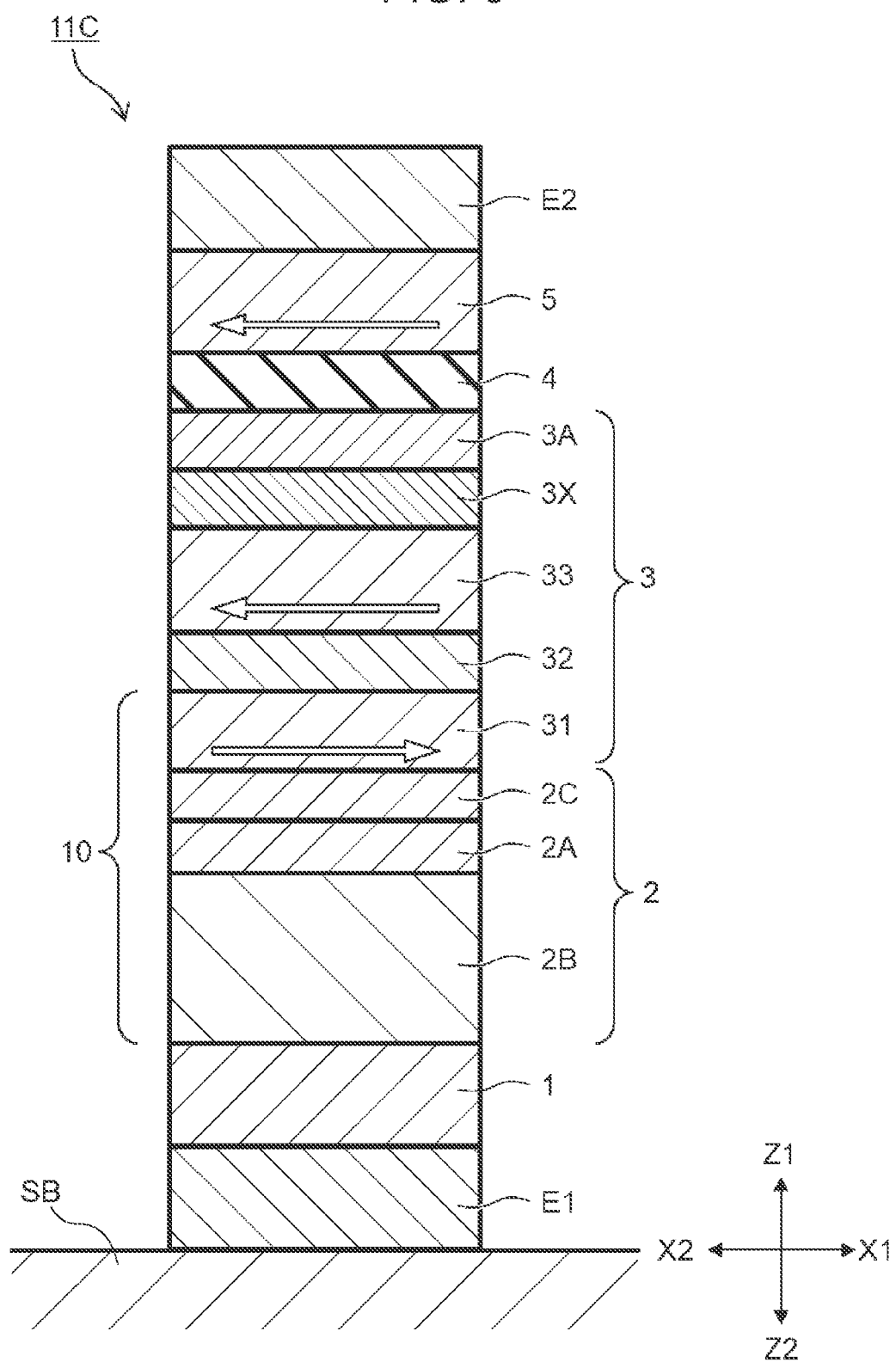
FIG. 8 is an explanatory drawing showing the configuration of a tunnel magnetoresistance effect device according to a third modified example (bottom type including an anti-diffusion layer) of the first embodiment of the present invention.
Figure 9:
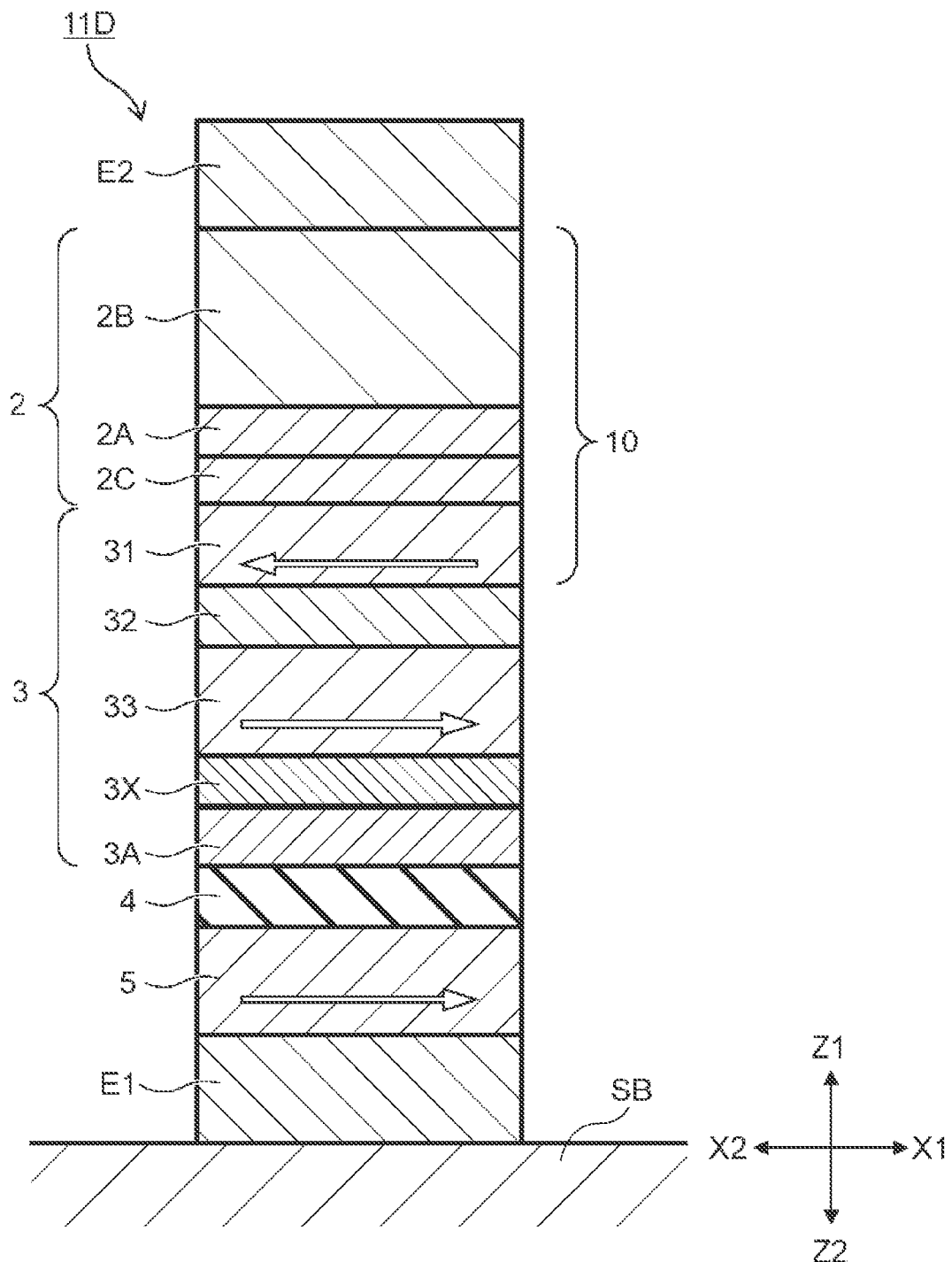
FIG. 9 is an explanatory drawing showing the configuration of a tunnel magnetoresistance effect device according to a fourth modified example (top type including an antidiffusion layer) of the first embodiment of the present invention.

Also, an anti-diffusion layer 3X composed of Ta or the like may be provided. A TMR device 11C shown in FIG. 8 includes the anti-diffusion layer 3X provided on the upper side (the upper electrode E2-side) of the second ferromagnetic layer 33, and the ferromagnetic layer 3A and the insulating barrier layer 4 are laminated in this order thereon. In a TMR device 11D shown in FIG. 9, the ferromagnetic layer 3A is laminated on the upper side (the upper electrode E2-side) of the insulating barrier layer 4, and the anti-diffusion layer 3X and the second ferromagnetic layer 33 are laminated in this order thereon.

The fixed magnetic layer 3 may not have the laminated ferristructure described above and may have a single-layer structure or another laminated structure of a magnetic layer. The free magnetic layer 5 may have a single-layer structure.

<Magnetic Detection Device According to Second Embodiment>

Figure 10:
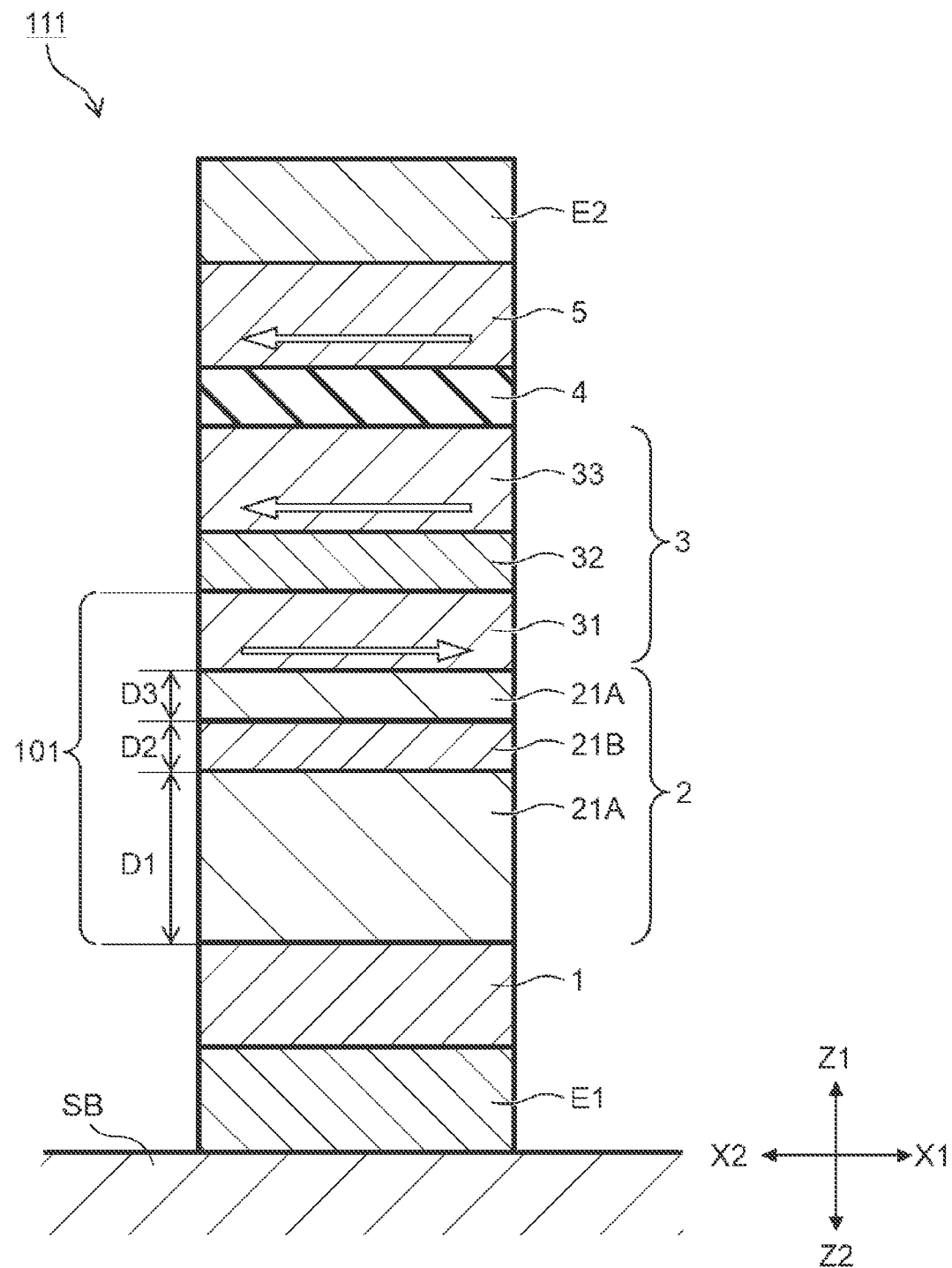
FIG. 10 is an explanatory drawing showing the configuration of a tunnel magnetoresistance effect device according to a second embodiment of the present invention.

FIG. 10 is an explanatory drawing schematically showing the structure of a tunnel magnetoresistance effect device (TMR device) according to a second embodiment of the present invention. In this embodiment, a layer having the same function as in the TMR element 11 shown in FIG. 2 is denoted by the same reference numeral, and the description thereof is omitted.

A TMR derive 111 according to the second embodiment and the TMR device 11 have a common basic configuration in which the layers are provided between the lower electrode E1, formed on the substrate SB, and the upper electrode E2, in which the seed layer 1, the antiferromagnetic layer 2, the fixed magnetic layer 3, the insulating barrier layer 4, and the free magnetic layer 5 are laminated in order from below, and in which the antiferromagnetic layer 2 and the first ferromagnetic layer 31 as a portion of the fixed magnetic layer 3 constitute an exchange coupling film 101. The TMR device 111 according to the second embodiment is different from the TMR element 11 according to the first embodiment in the structure of the antiferromagnetic layer 2.

The antiferromagnetic layer 2 of the TMR device 111 according to the second embodiment has an alternately laminated structure of three layers, in which an $X^1$Cr layer 21A and an $X^2$Mn layer 21B are alternately laminated (wherein each of $X^1$ and $X^2$ is one or two or more elements selected from the group consisting of the platinum group elements and Ni, and $X^1$ and $X^2$ may be the same or different). Each of the layers is deposited by a sputtering process or a CVD process after deposition, the antiferromagnetic layer 2 is regularized by annealing and is exchange-coupled with the first ferromagnetic layer 31, thereby producing the exchange-coupled magnetic field Hex in the first ferromagnetic layer 31.

As a form of the alternately laminated structure in which three or more layers including the $X^1$Cr layer 21A and the $X^2$Mn layer 21B are laminated, FIG. 10 shows a three-layer structure of $X^1$Cr layer 21A/$X^2$Mn layer 21B/$X^1$Cr layer 21A in which the $X^1$Cr layer 21A is in contact with the first ferromagnetic layer 31. However, the $X^1$Cr layer 21A and the $X^2$Mn layer 21B may be replaced with each other to form a three-layer structure of $X^2$Mn layer 21B/$X^1$Cr layer 21A/$X^2$Mn layer 21B. In the case of the three-layer structure, the $X^2$Mn layer 21B is in contact with the first ferromagnetic layer 31. The form of the antiferromagnetic layer 2 having the number of layers of 4 or more is described later.

When the $X^1$Cr layer 21A is closest to the first ferromagnetic layer 31, from the viewpoint of enhancing the exchange-coupled magnetic field Hex, the thickness D1 of the $X^1$Cr layer 21A on the seed layer 1 side is preferably larger than the thickness D3 of the $X^1$Cr layer 21A in contact with the first ferromagnetic layer 31. Also, the thickness D1 of the $X^1$Cr layer 21A of the antiferromagnetic layer 21 is preferably larger than the thickness D2 of the $X^2$Mn layer 21B. The ratio (D1:D2) of the thickness D1 to the thickness D2 is more preferably 5:1 to 100:1 and still more preferably 10:1 to 50:1. The ratio (D1:D3) of the thickness D1 to the thickness D3 is more preferably 5:1 to 100:1 and still more preferably 10:1 to 50:1.

In the case of the $X^2$Mn layer 21B/$X^1$Cr layer 21A/$X^2$Mn layer 21B three-layer structure in which the $X^2$Mn layer 21B is closest to the first ferromagnetic layer 31, the thickness D3 of the $X^2$Mn layer 21B closest to the first ferromagnetic layer 31 may be made equal to the thickness D1 of the $X^2$Mn layer 21B on the seed layer 1 side.

From the viewpoint of enhancing the exchange-coupled magnetic field Hex, $X^1$ of the $X^1$Cr layer 21A is preferably Pt, and $X^2$ of the $X^2$Mn layer 21B is preferably Pt or Ir and more preferably Pt. When the $X^1$Cr layer 21A is a PtCr layer, $Pt_X Cr_{100at\%-X}$ (X is 45 at % or more and 62 at % or less) is preferred, and $X^1_X Cr_{100at\%-X}$ (X is 50 at % or more 57 at % or less) is more preferred. From the same viewpoint, the $X^2$Mn layer 21B is preferably a PtMn layer.

Figure 11:
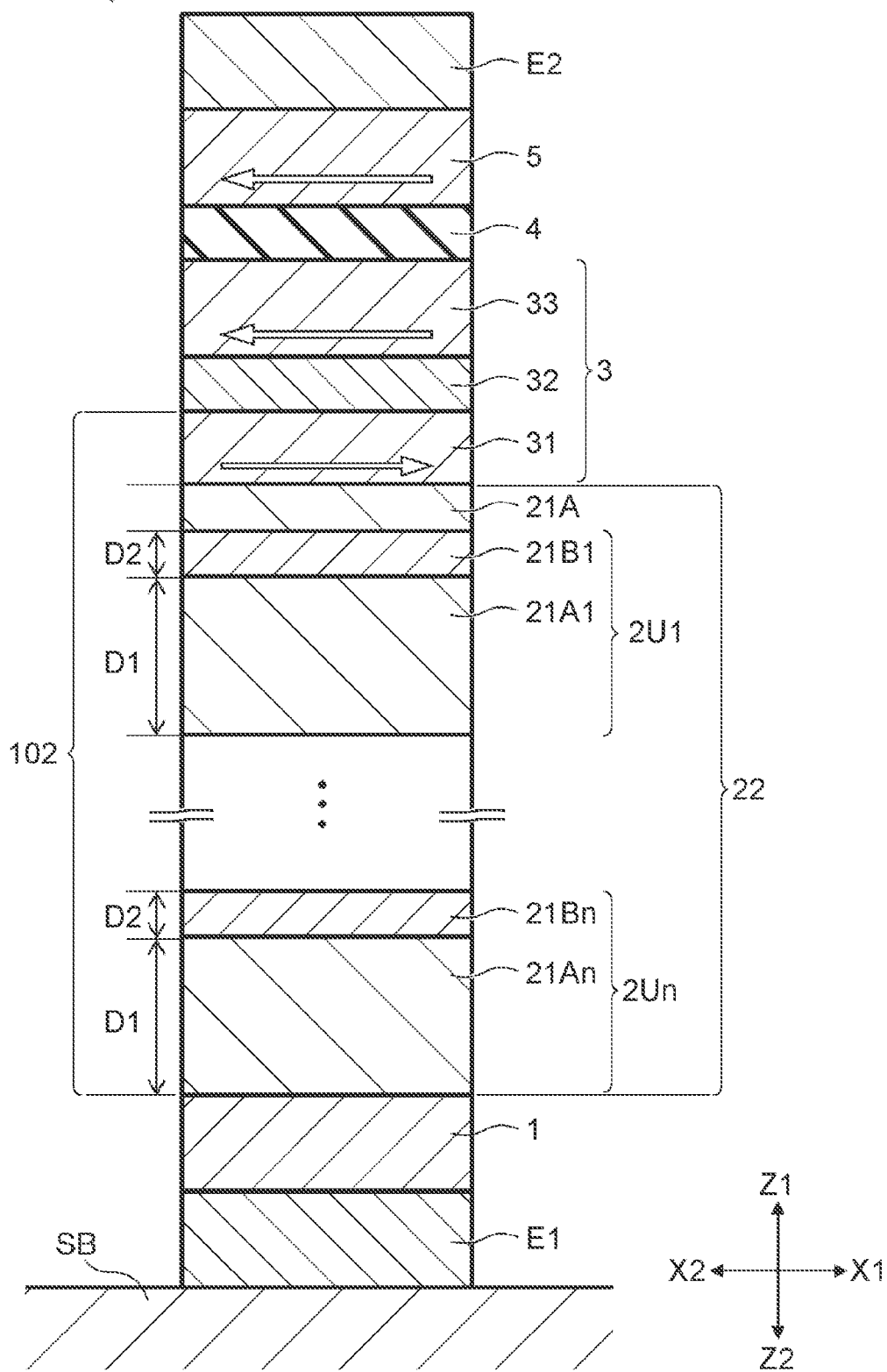
FIG. 11 is an explanatory drawing showing the configuration of a tunnel magnetoresistance effect device according to a modified example of the second embodiment of the present invention.

FIG. 11 is an explanatory drawing showing the film configuration of a TMR device 112 according to a modified example of the second embodiment of the present invention. In this example, layers having the same function as in the TMR derive 111 shown in FIG. 10 is denoted by the same reference numeral, and the description thereof is omitted. In the TMR device 112, the first ferromagnetic layer 31 and the antiferromagnetic layer 22 constitute an exchange coupling film 102.

Figure 7:
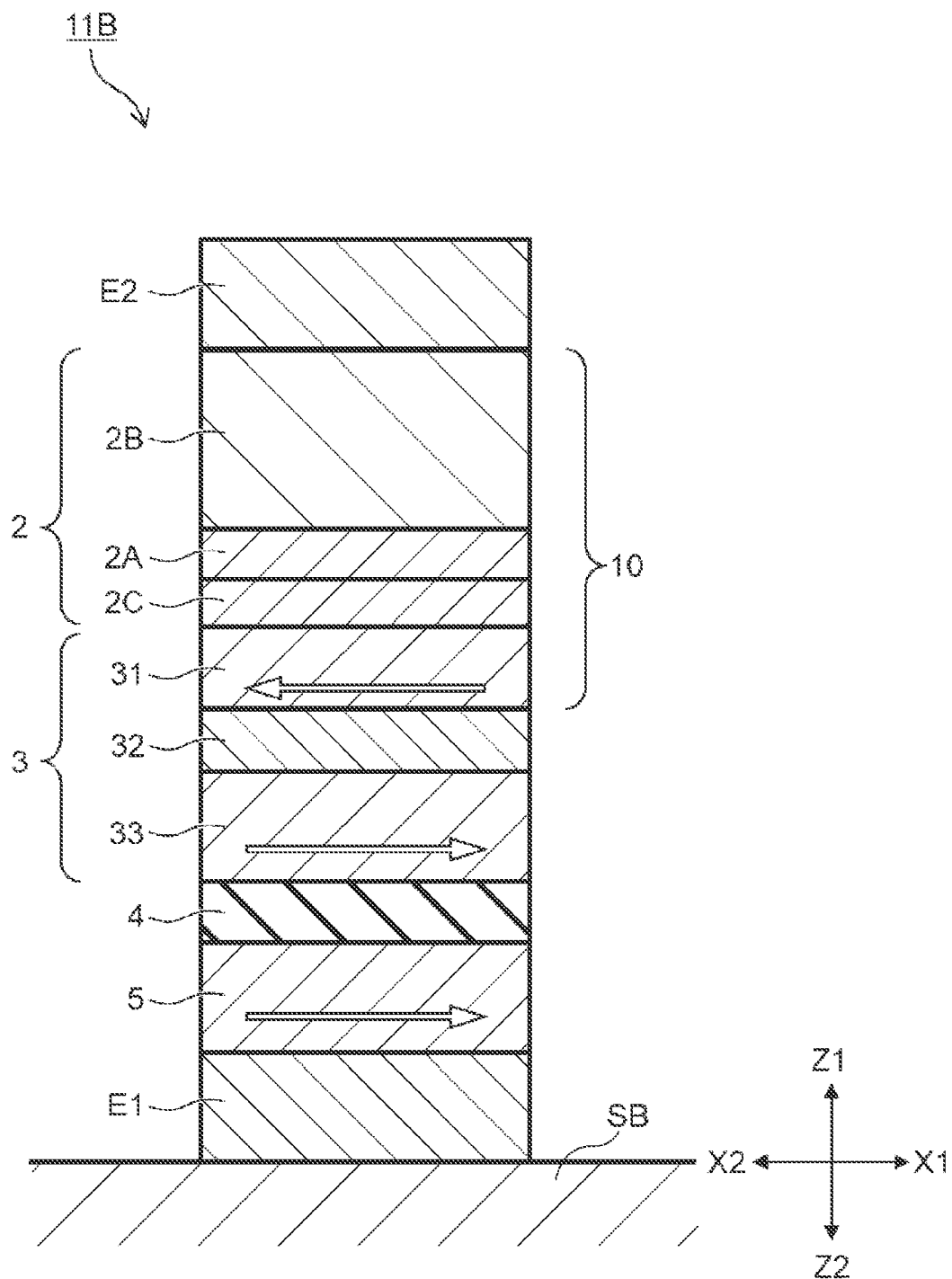
FIG. 7 is an explanatory drawing showing the configuration of a tunnel magnetoresistance effect device according to a second modified example (top type) of the first embodiment of the present invention.

The TMR device 112 shown in FIG. 11 is different from the TMR device 111 shown in FIG. 10 in that the number of layers involved in the antiferromagnetic layer 22 is 4 or more, and in that the TMR device 112 has a unit laminated portion in which a plurality of units each including the $X^1$Cr layer 21A and the $X^2$Mn layer 21B (refer to FIG. 11) are laminated. In FIG. 7, the unit laminated portion 2U1~2Un (n is an integer of 2 or more) is formed by laminating n layers from the unit 2U1 including the $X^1$Cr layer 21A1 and the $X^2$Mn layer 21B1 to the unit 2Un including the $X^1$Cr layer 21An and the $X^2$Mn layer 21Bn.

In the unit laminated portion 2U1~2Un, the $X^1$Cr layer 21A1 to the $X^1$Cr layer 21An have the same thickness D1, and the $X^2$Mn layer 21B1 to the $X^2$Mn layer 21Bn have the same thickness D2. The units 2U1 to 2Un having the same configuration are laminated, and the resultant laminate is annealed, thereby producing the high exchange-coupled magnetic field Hex in the first ferromagnetic layer 31 of the exchange coupling film 102 and realizing the enhancement of the high-temperature stability of the antiferromagnetic layer 22.

Although the antiferromagnetic layer 22 shown in FIG. 11 includes the unit laminated portion 2U1~2Un and the $X^1Cr$ layer 21A which is in contact with the first ferromagnetic layer 31, the antiferromagnetic layer 22 may include only the unit laminated portion 2U1~2Un. In the antiferromagnetic layer 22 formed by a laminate including only the unit laminated portion 2U1~2Un, the $X^2Mn$ layer 21Bn is in contact with the first ferromagnetic layer 31.

The number of layers laminated in the unit laminated portion 2U1~2Un is determined according to the thickness D1 and the thickness D2 of the antiferromagnetic layer 22. For example, when the thickness D2 is 5 to 15 Å and the thickness D2 is 30 to 40 Å, the number of layers laminated is preferably 3 to 15 and more preferably 5 to 12 in order to increase the exchange-coupled magnetic field Hex in a high-temperature environment.

The TMR devices 11, 111, or 112 according to the embodiment of the present invention allow the antiferromagnetic layer 2, 21, or 22 to properly function even when placed in a high-temperature environment and high-magnetic-field environment. Therefore, a magnetic device provided with the TMR devices 11, 111, or 112 can be properly operated even in a severe environment.

Examples of the magnetic device include a magnetic head having the TMR device 11, 111, or 112 as a reading device, a magnetic memory having the TMR device 11, 111, or 112 as a recording device, and a magnetic sensor having the TMR device 11, 111, or 112 as a detection device.

Figure 12A:
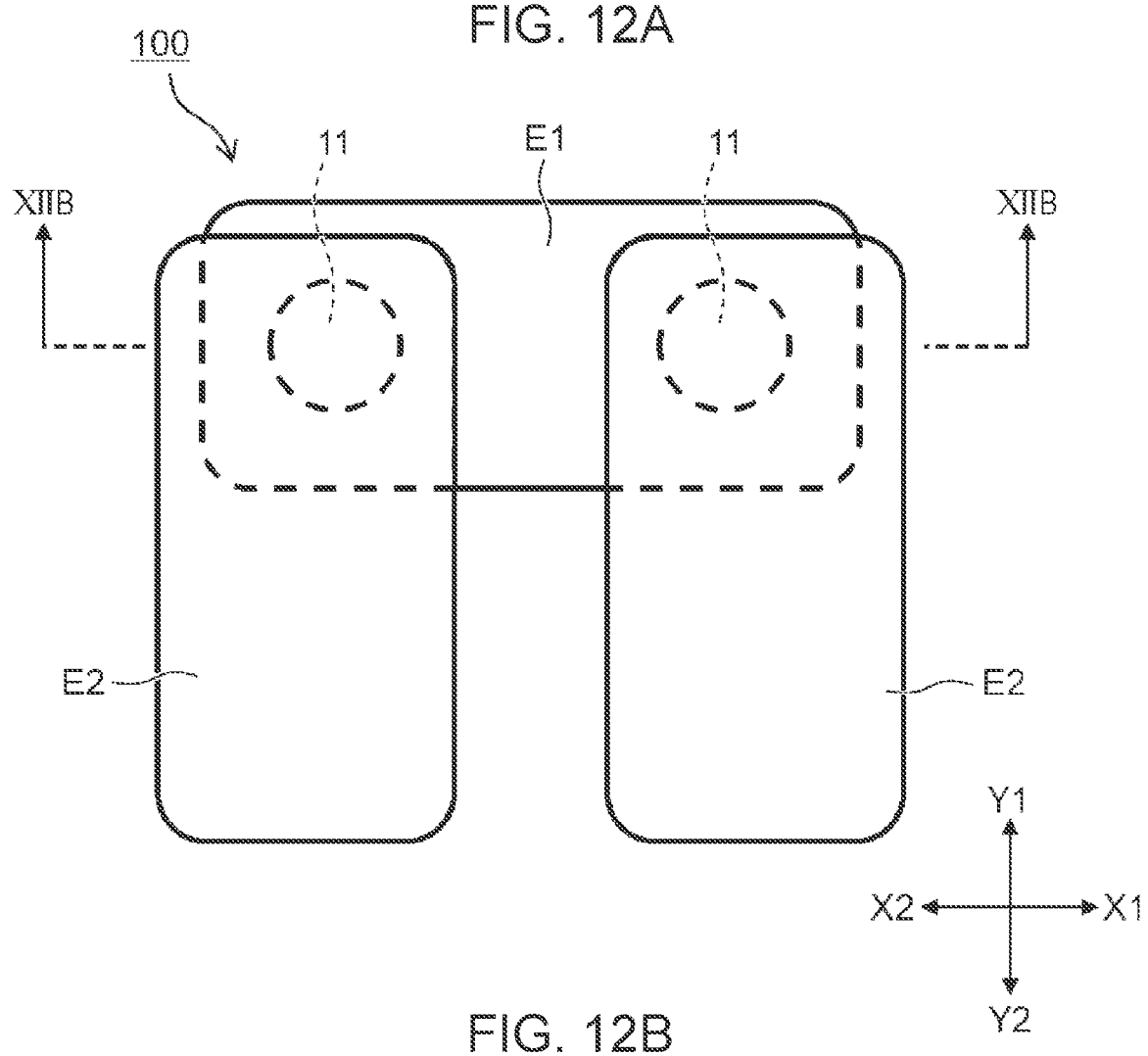
FIG. 12A is a plan view illustrating the structure of a magnetic sensor as an example of a magnetic device according to an embodiment of the present invention.
Figure 12B:
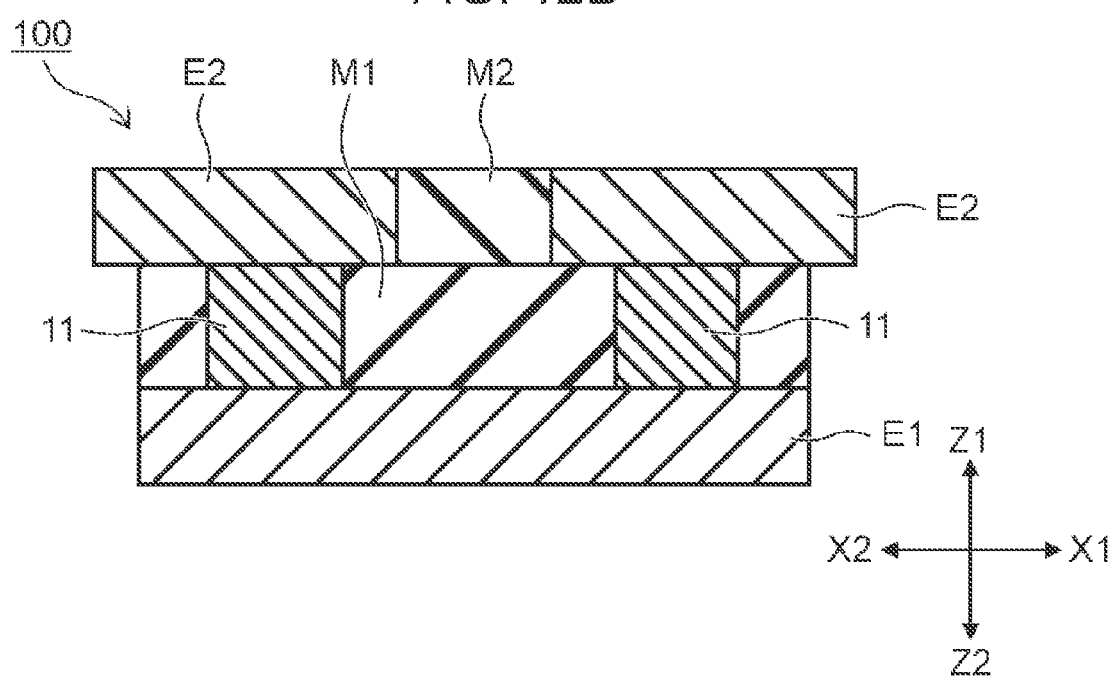
FIG. 12B is a sectional view taken along line XIIB-XIIB in FIG. 12A.
Figure 13:
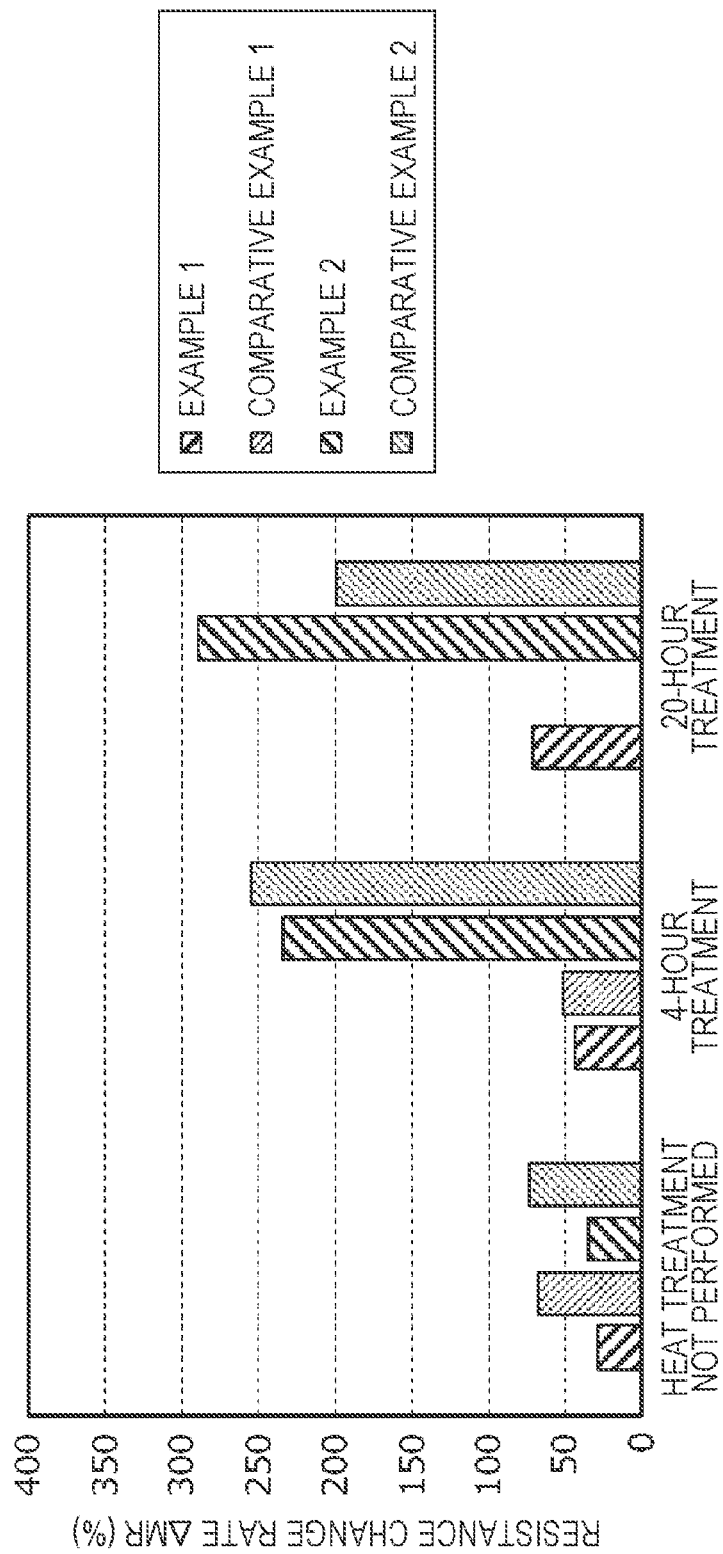
FIG. 13 is a graph showing resistance change rates ΔMR in examples and comparative examples.

FIG. 12A is a plan view for explaining the structure of a magnetic sensor as an example of the magnetic device. FIG. 12B is a sectional view taken along XIIB-XIIB line in FIG. 12A.

As shown in FIGS. 12A and 12B, a magnetic sensor 100 has an arrangement in which two TMR devices 11 are aligned in the X1-X2 direction on the Y1 side in the Y1-Y2 direction of the lower electrode E1. The two TMR derives 11 are connected to respective different upper electrodes E2. Although not shown in FIG. 12A, as shown in FIG. 12B, an insulating layer M1 is provided around the two TMR devices 11, and an insulating layer M2 is also provided around each of the upper electrodes E2.

Therefore, the two TMR devices 11 are connected in series by connecting the upper electrodes E2 to respective external wirings, whereby a circuit with a resistance value, which varies according to an external magnetic field, can be configured. The strength and direction of the external magnetic field may be measured based on an electric signal relating to the resistance value of the magnetic sensor 100, or the magnetic sensor may be used as a magnetosensitive switch.

The embodiments are described above for facilitating the understanding of the present invention, but not for limiting the present invention. Therefore, the concept of each of the factors disclosed in the embodiments described above includes all design modifications and equivalents belonging to the technical scope of the present invention. For example, in the exchange coupling film described above, the PtMn layer 2A is in contact with the first ferromagnetic layer 31, that is, the PtMn layer 2A is laminated directly on the first ferromagnetic layer 31 laminated. However, another layer (for example, a Mn layer or IrMn layer) containing Mn may be laminated between the PtMn layer 2A and the first ferromagnetic layer 31. Although, in the embodiments described above, the antiferromagnetic layer 2, 21, or 22 is laminated to be located nearer to the seed layer 1 than the first ferromagnetic layer 31, the first ferromagnetic layer 31 may be laminated to be located nearer to the seed layer 1 than the antiferromagnetic layer 2, 21, or 22.

As described above, the TMR device 11, 111, or 112 has heat resistance and strong-magnetic field resistance, and thus an apparatus provided with the magnetic device described above can be used with high reliability even in various environments such as a high-magnetic-field environment, a high-temperature environment, and the like. Examples of the apparatus include electronic apparatuses such as a computer, a tablet terminal, and the like, transport apparatuses such as a vehicle, an aircraft, a ship, and the like, telecommunication apparatuses such as a cellular phone, a smartphone, telecommunication equipment, and the like, medical apparatuses such as a testing device and the like, production instrument such as a robot and the like, infrastructure apparatuses such as an electrical generator, and the like.

EXAMPLES

The present embodiments are described in further detail below by examples etc., but the scope of the present invention is not limited to these examples etc.

Example 1

A laminate having a film configuration below was produced. In examples and comparative examples below, a numeral value in parenthesis represents a thickness (Å).

Substrate SB: Si substrate with an alumina-laminated surface/lower electrode E1: [Ta (30)/Cu (200)/Ta (30)/Cu (200)/Ta (150)]/seed layer 1: NiFeCr (42)/antiferromagnetic layer 2: [PtCr layer 2B: $Pt_{50at\%}Cr_{50at\%}$ (300)/PtMn layer 2A: $Pt_{50at\%}Mn_{50at\%}$ (14)/IrMn layer: $Ir_{20at\%}Mn_{80at\%}$ (8)]/fixed magnetic layer 3: {first ferromagnetic layer 31: $Co_{90at\%}Fe_{10at\%}$ (40)/nonmagnetic intermediate layer 32: Ru (8)/second ferromagnetic layer 33: [$Fe_{60at\%}Co_{40at\%}$ (14)/$Co_{35at\%}Fe_{35at\%}B_{30at\%}$ (10)/$Fe_{50at\%}Co_{50at\%}$ (6)]}/insulating barrier layer 4: $Mg_{50at\%}O_{50at\%}$ (20)/free magnetic layer 5: [$Fe_{50at\%}Co_{50at\%}$ (10)/$Co_{35at\%}Fe_{35at\%}B_{30at\%}$ (30)]/upper electrode E2: [Ru (50)/Ta (100)/Ru (70)]

Table 1 shows the configuration of a laminate according to Example 1.

TABLE 1

| | Component | Composition | Thickness (Å) |
|---|---|---|---|
| | Upper electrode E2 | Ru | 70 |
| | | Ta | 100 |
| | | Ru | 50 |
| | Free magnetic layer 5 | (50CoFe)B30 | 30 |
| | | 50FeCo | 10 |
| | Insulating barrier layer 4 | MgO | 20 |
| Fixed layer 3 | Second ferromagnetic layer 33 | 50FeCo | 6 |
| | | (50CoFe)B30 | 10 |
| | | 60FeCo | 14 |
| | Nonmagnetic intermediate layer 32 | Ru | 8 |
| | First ferromagnetic layer 31 | 90CoFe | 40 |
| Antiferromagnetic layer 2 | IrMn layer 2C | 20IrMn | 8 |
| | PtMn layer 2A | 50PtMn | 14 |
| | PtCr layer 2B | 50PtCr | 300 |

TABLE 1-continued

| Component | Composition | Thickness (Å) |
|---|---|---|
| Seed layer 1 | NiFeCr | 42 |
| Lower electrode E1 | Ta | 150 |
| | Cu | 200 |
| | Ta | 30 |
| | Cu | 200 |
| | Ta | 30 |
| Alumina | | 0.1 μm |
| Si substrate | | 0.5 mm |

A TMR device 11A was produced from the resultant laminate or through the following heat treatment.

Example 1-1

Heat treatment was not performed (no heat treatment).

Example 1-2

Heat treatment was performed by annealing for 4 hours at 350° C. in a magnetic field environment of 15 kOe (4-hour treatment).

Example 1-3

Heat treatment was performed by annealing for 20 hours at 350° C. in a magnetic field environment of 15 kOe (20-hour treatment).

Example 1-4

Heat treatment was performed by annealing for 10 hours at 350° C. in a magnetic field environment of 15 kOe (10-hour treatment).

Example 2

A laminate having a film configuration below was produced.

Substrate SB: Si substrate with an alumina-laminated surface/lower electrode E1: [Ta (30)/Cu (200)/Ta (30)/Cu (200)/Ta (150)]/seed layer 1: NiFeCr (42)/antiferromagnetic layer 2: [PtCr layer 2B: $Pt_{50at\%}Cr_{50at\%}$ (300)/PtMn layer 2A: $Pt_{50at\%}Mn_{50at\%}$ (14)/IrMn layer: $Ir_{20at\%}Mn_{80at\%}$ (8)]/fixed magnetic layer 3: {first ferromagnetic layer 31: $Co_{90at\%}Fe_{10at\%}$ (40)/nonmagnetic intermediate layer 32: Ru (8)/second ferromagnetic layer 33: $Fe_{60at\%}Co_{40at\%}$ (16)/anti-diffusion layer 3X: Ta (3)/ferromagnetic layer 3A: [$Co_{35at\%}Fe_{35at\%}B_{30at\%}$ (10)/$Fe_{50at\%}Co_{50at\%}$ (6)]}/insulating barrier layer 4: $Mg_{50at\%}O_{50at\%}$ (20)/free magnetic layer 5: [$Fe_{50at\%}Co_{50at\%}$ (10)/$Co_{35at\%}Fe_{35at\%}B_{30at\%}$ (30)]/upper electrode E2: [Ru (50)/Ta (100)/Ru (70)]

Table 2 shows the configuration of a laminate according to Example 2.

TABLE 2

| Component | | Composition | Thickness (Å) |
|---|---|---|---|
| Upper electrode E2 | | Ru | 70 |
| | | Ta | 100 |
| | | Ru | 50 |
| Free magnetic layer 5 | | (50CoFe)B30 | 30 |
| | | 50FeCo | 10 |
| Insulating barrier layer 4 | | MgO | 20 |
| Fixed layer 3 | Ferromagnetic layer 3A | 50FeCo | 6 |
| | | (50CoFe)B30 | 10 |

TABLE 2-continued

| Component | | Composition | Thickness (Å) |
|---|---|---|---|
| | Anti-diffusion layer 3X | Ta | 3 |
| | Second ferromagnetic layer 33 | 60FeCo | 16 |
| | Nonmagnetic intermediate layer 32 | Ru | 8 |
| | First ferromagnetic layer 31 | 90CoFe | 40 |
| Antiferromagnetic layer 2 | IrMn layer 2C | 20IrMn | 8 |
| | PtMn layer 2A | 50PtMn | 14 |
| | PtCr layer 2B | 50PtCr | 300 |
| Seed layer 1 | | NiFeCr | 42 |
| Lower electrode E1 | | Ta | 150 |
| | | Cu | 200 |
| | | Ta | 30 |
| | | Cu | 200 |
| | | Ta | 30 |
| Alumina | | | 0.1 μm |
| Si substrate | | | 0.5 mm |

A TMR device 11C was produced from the resultant laminate or through the following heat treatment.

Example 2-1

Heat treatment was not performed (no heat treatment).

Example 2-2

Heat treatment was performed by annealing for 4 hours at 350° C. in a magnetic field environment of 15 kOe (4-hour treatment).

Example 2-3

Heat treatment was performed by annealing for 20 hours at 350° C. in a magnetic field environment of 15 kOe (20-hour treatment).

Example 2-4

Heat treatment was performed by annealing for 10 hours at 350° C. in a magnetic field environment of 15 kOe (10-hour treatment).

Comparative Example 1

A laminate was produced, in which in the laminate of Example 1, the antiferromagnetic layer 2 was composed of a IrMn layer: $Ir_{20at\%}Mn_{80at\%}$ with a thickness of 80 Å (refer to Table 3). A TMR device was produced from the resultant laminate or through the following heat treatment.

TABLE 3

| Component | | Composition | Thickness (Å) |
|---|---|---|---|
| Upper electrode E2 | | Ru | 70 |
| | | Ta | 100 |
| | | Ru | 50 |
| Free magnetic layer 5 | | (50CoFe)B30 | 30 |
| | | 50FeCo | 10 |
| Insulating barrier layer 4 | | MgO | 20 |
| Fixed layer 3 | Second ferromagnetic layer 33 | 50FeCo | 6 |
| | | (50CoFe)B30 | 10 |
| | | 60FeCo | 14 |

TABLE 3-continued

| Component | Composition | Thickness (Å) |
|---|---|---|
| Nonmagnetic intermediate layer 32 | Ru | 8 |
| First ferromagnetic layer 31 | 90CoFe | 40 |
| Antiferromagnetic layer 2 | 20IrMn | 80 |
| Seed layer 1 | Ru | 40 |
| Lower electrode E1 | Ta | 150 |
|  | Cu | 200 |
|  | Ta | 30 |
|  | Cu | 200 |
|  | Ta | 30 |
| Alumina |  | 0.1 μm |
| Si substrate |  | 0.5 mm |

Comparative Example 1-1

Heat treatment was not performed (no heat treatment).

Comparative Example 1-2

Heat treatment was performed by annealing for 4 hours at 350° C. in a magnetic field environment of 15 kOe (4-hour treatment).

Comparative Example 1-3

Heat treatment was performed by annealing for 20 hours at 350° C. in a magnetic field environment of 15 kOe (20-hour treatment).

Comparative Example 1-4

Heat treatment was performed by annealing for 10 hours at 350° C. in a magnetic field environment of 15 kOe (10-hour treatment).

Comparative Example 2

A laminate was produced, in which in the laminate of Example 2, the antiferromagnetic layer 2 was composed of a IrMn layer: $Ir_{20at\%}Mn_{80at\%}$ with a thickness of 80 Å (refer to Table 4). A TMR device was produced from the resultant laminate or through the following heat treatment.

TABLE 4

| Component | | Composition | Thickness (Å) |
|---|---|---|---|
| Upper electrode E2 | | Ru | 70 |
|  | | Ta | 100 |
|  | | Ru | 50 |
| Free magnetic layer 5 | | (50CoFe)B30 | 30 |
|  | | 50FeCo | 10 |
| Insulating barrier layer 4 | | MgO | 20 |
| Fixed layer 3 | Ferromagnetic layer 3A | 50FeCo | 6 |
|  |  | (50CoFe)B30 | 10 |
|  | Anti-diffusion layer 3X | Ta | 3 |
|  | Second ferromagnetic layer 33 | 60FeCo | 16 |
|  | Nonmagnetic intermediate layer 32 | Ru | 8 |
|  | First ferromagnetic layer 31 | 90CoFe | 40 |
| Antiferromagnetic layer 2 | | 20IrMn | 80 |
| Seed layer 1 | | NiFeCr | 42 |
| Lower electrode E1 | | Ta | 150 |
|  | | Cu | 200 |
|  | | Ta | 30 |
|  | | Cu | 200 |

TABLE 4-continued

| Component | Composition | Thickness (Å) |
|---|---|---|
|  | Ta | 30 |
| Alumina |  | 0.1 μm |
| Si substrate |  | 0.5 mm |

Comparative Example 2-1

Heat treatment was not performed (no heat treatment).

Comparative Example 2-2

Heat treatment was performed by annealing for 4 hours at 350° C. in a magnetic field environment of 15 kOe (4-hour treatment).

Comparative Example 2-3

Heat treatment was performed by annealing for 20 hours at 350° C. in a magnetic field environment of 15 kOe (20-hour treatment).

Comparative Example 2-4

Heat treatment was performed by annealing for 10 hours at 350° C. in a magnetic field environment of 15 kOe (10-hour treatment).

The resistance change rate ΔMR (unit: %) was measured by annealing for each of the TMR devices according to Example 1, Example 2, Comparative Example 1, and Comparative Example 2. The results are shown in Table 5 and Table 13.

TABLE 5

|  | Example 1 | Example 2 | Comparative Example 1 | Comparative Example 2 |
|---|---|---|---|---|
| No heat treatment | 29 | 35 | 67 | 73 |
| 4-hour treatment | 44 | 234 | 52 | 255 |
| 20-hour treatment | 71 | 289 | 1 | 199 |

As shown in Table 5 and Table 13, it was confirmed that the resistance change rate ΔMR of the TMR device according to each of the examples is increased by generating the exchange-coupled magnetic field Hex in the first ferromagnetic layer 31 through heat treatment. It was also confirmed that the resistance change rate ΔMR is increased with increases in the heat treatment time. On the other hand, with respect to the TMR devices according to the comparative examples, in the case of not having the anti-diffusion layer 3X (Comparative Example 1), the resistance change rate ΔMR was decreased by heat treatment, and the resistance change rate ΔMR was not substantially recognized by 20-hour heat treatment (Comparative Example 1-3). Even in the case of having the anti-diffusion layer 3X (Comparative Example 2), the resistance change rate ΔMR had a tendency to decrease with increases in the heat treatment time. Therefore, it was confirmed that the TMR device provided with the exchange coupling film according to the present invention has a high resistance change rate ΔMR in high-temperature and high-magnetic-field environments, excellent heat resistance, and strong-magnetic-field resistance as compared with a TMR device provided with an exchange coupling film using a usual antiferromagnetic layer.

Example 3

In order to confirm the relationship between the strength of exchange-coupled magnetic field Hex and the environmental temperature, a laminated film having the following configuration was formed.

Substrate SB: Si substrate with an alumina-laminated surface/underlaying layer: NiFeCr (42)/antiferromagnetic layer/fixed magnetic layer: 90CoFe (100)/protective layer: Ta (90)

In this example, the antiferromagnetic layer had a laminated configuration of 51PtCr (280)/50PtMn (20) from the side near the underlaying layer, and the magnetization of the fixed magnetic layer and the antiferromagnetic layer was fixed by annealing the resultant laminated film at 350° C. for 5 hours in a magnetic field of 1 kOe, thereby producing an exchange coupling film.

Example 4

In the laminated film of Example 3, the magnetization of the fixed magnetic layer and the antiferromagnetic layer was fixed by annealing the resultant laminated film at 400° C. for 5 hours in a magnetic field of 1 kOe, thereby producing an exchange coupling film.

Example 5

A laminated film was formed, in which in Example 4, the antiferromagnetic layer had a laminated configuration of 54PtCr(280)/50PtMn(10) from the side near the underlaying layer, and an exchange coupling film was produced by the same annealing treatment as in Example 4.

Example 6

A laminated film was formed, in which in Example 4, the antiferromagnetic layer had a laminated configuration of 54PtCr(280)/50PtMn(20) from the side near the underlaying layer, and an exchange coupling film was produced by the same annealing treatment as in Example 4.

Comparative Example 3

A laminated film was formed, in which in Example 4, the antiferromagnetic layer had a laminated configuration of 20IrMn(80), and an exchange coupling film was produced by the same annealing treatment as in Example 4.

Example 7

In order to confirm the relationship between the strength of exchange-coupled magnetic field Hex and the environmental temperature, a laminated film having the following configuration was formed.

Substrate SB: Si substrate with an alumina-laminated surface/underlaying layer: NiFeCr (42)/fixed magnetic layer: [Cu (40)/Ru (20)/90CoFe (100)]/antiferromagnetic layer/protective layer: Ta (90)

In this example, the antiferromagnetic layer had a laminated configuration of 22IrMn (6)/50PtCr (12)/51PtMn (300) from the side near the fixed magnetic layer, and the magnetization of the fixed magnetic layer and the antiferromagnetic layer was fixed by annealing the resultant laminated film at 350° C. for 5 hours in a magnetic field of 1 kOe, thereby producing an exchange coupling film.

Example 8

A laminated film was formed, in which, in Example 7, the antiferromagnetic layer had a laminated configuration of 51PtCr (6)/unit laminated portion (number of layers laminated; 7): [48PtMn (6)/51PtCr (34)] from the side near the fixed magnetic layer, and an exchange coupling film was produced by the same annealing treatment as in Example 7.

By using VSM (vibrating sample magnetometer), the magnetization curve of the magnetic field applying bias film 12A according to each of Example 1, Comparative Example 1, and Comparative Example 2 was measured while changing the environmental temperature (unit: ° C.). Based on the resultant hysteresis loop, the exchange-coupled magnetic field Hex (unit: Ce) at each of the temperatures was determined. Table 6 to Table 12 show the exchange-coupled magnetic field Hex at each of the temperatures and the value (room temperature-normalized exchange-coupled magnetic field) obtained by normalizing the exchange-coupled magnetic field Hex at each of the temperatures by the exchange-coupled magnetic field Hex at room temperature. In addition, FIG. 14 is a graph showing the relationship between the room temperature-normalized exchange-coupled magnetic field Hex and the measurement temperature.

TABLE 6

Comparative Example 3

| Temperature (° C.) | Hex (Oe) | Normalized Hex |
|---|---|---|
| 22 | 83 | 1.00 |
| 42 | 79 | 0.95 |
| 64 | 76 | 0.92 |
| 84 | 73 | 0.88 |
| 104 | 65 | 0.79 |
| 124 | 63 | 0.76 |
| 144 | 55 | 0.67 |
| 165 | 50 | 0.61 |
| 181 | 46 | 0.56 |
| 201 | 38 | 0.45 |
| 220 | 34 | 0.41 |
| 259 | 14 | 0.17 |
| 304 | 0 | 0.00 |

TABLE 7

Example 3

| Temperature (° C.) | Hex (Oe) | Normalized Hex |
|---|---|---|
| 24 | 335 | 1.00 |
| 40 | 330 | 0.99 |
| 64 | 330 | 0.99 |
| 84 | 320 | 0.96 |
| 104 | 325 | 0.97 |
| 125 | 310 | 0.93 |
| 143 | 305 | 0.91 |
| 163 | 305 | 0.91 |
| 183 | 295 | 0.88 |
| 203 | 295 | 0.88 |
| 223 | 295 | 0.88 |
| 266 | 285 | 0.85 |
| 305 | 250 | 0.75 |
| 344 | 245 | 0.73 |
| 384 | 205 | 0.61 |
| 423 | 180 | 0.54 |
| 462 | 130 | 0.39 |
| 500 | 50 | 0.15 |

TABLE 8

Example 4

| Temperature (° C.) | Hex (Oe) | Normalized Hex |
|---|---|---|
| 22 | 400 | 1.00 |
| 44 | 400 | 1.00 |
| 63 | 385 | 0.96 |
| 84 | 385 | 0.96 |
| 104 | 375 | 0.94 |
| 124 | 380 | 0.95 |
| 146 | 360 | 0.90 |
| 164 | 350 | 0.88 |
| 185 | 355 | 0.89 |
| 204 | 345 | 0.86 |
| 224 | 340 | 0.85 |
| 266 | 340 | 0.85 |
| 307 | 305 | 0.76 |
| 345 | 265 | 0.66 |
| 385 | 220 | 0.55 |
| 424 | 165 | 0.41 |
| 463 | 110 | 0.28 |
| 500 | 25 | 0.06 |

TABLE 9

Example 5

| Temperature (° C.) | Hex (Oe) | Normalized Hex |
|---|---|---|
| 25 | 485 | 1.00 |
| 42 | 485 | 1.00 |
| 66 | 485 | 1.00 |
| 85 | 483 | 0.99 |
| 104 | 480 | 0.99 |
| 124 | 480 | 0.99 |
| 145 | 478 | 0.98 |
| 165 | 478 | 0.98 |
| 185 | 470 | 0.97 |
| 205 | 475 | 0.98 |
| 224 | 470 | 0.97 |
| 268 | 453 | 0.93 |
| 283 | 435 | 0.90 |
| 302 | 415 | 0.86 |
| 345 | 350 | 0.72 |
| 385 | 280 | 0.58 |
| 423 | 198 | 0.41 |
| 462 | 110 | 0.23 |
| 500 | 20 | 0.04 |

TABLE 10

Example 6

| Temperature (° C.) | Hex (Oe) | Normalized Hex |
|---|---|---|
| 22 | 530 | 1.00 |
| 42 | 540 | 1.02 |
| 63 | 525 | 0.99 |
| 84 | 540 | 1.02 |
| 104 | 525 | 0.99 |
| 125 | 510 | 0.96 |
| 144 | 510 | 0.96 |
| 165 | 500 | 0.94 |
| 184 | 480 | 0.91 |
| 204 | 480 | 0.91 |
| 224 | 475 | 0.90 |
| 268 | 465 | 0.88 |
| 305 | 425 | 0.80 |
| 345 | 395 | 0.75 |
| 385 | 365 | 0.69 |
| 424 | 275 | 0.52 |
| 463 | 165 | 0.31 |
| 500 | 50 | 0.09 |

TABLE 11

Example 7

| Temperature (° C.) | Hex (Oe) | Normalized Hex |
|---|---|---|
| 22 | 222 | 1.00 |
| 43 | 220 | 0.99 |
| 65 | 218 | 0.98 |
| 85 | 216 | 0.97 |
| 106 | 212 | 0.96 |
| 125 | 210 | 0.94 |
| 145 | 206 | 0.93 |
| 164 | 199 | 0.90 |
| 184 | 195 | 0.88 |
| 204 | 190 | 0.86 |
| 224 | 185 | 0.83 |
| 267 | 168 | 0.76 |
| 305 | 143 | 0.64 |
| 344 | 100 | 0.45 |
| 383 | 53 | 0.24 |
| 402 | 34 | 0.15 |
| 421 | 15 | 0.07 |
| 441 | 8 | 0.03 |
| 461 | 4 | 0.02 |
| 481 | 0 | 0.00 |
| 501 | 0 | 0.00 |

TABLE 12

Example 8

| Temperature (° C.) | Hex (Oe) | Normalized Hex |
|---|---|---|
| 22 | 253 | 1.00 |
| 69 | 250 | 0.99 |
| 109 | 243 | 0.96 |
| 124 | 237 | 0.93 |
| 145 | 234 | 0.93 |
| 165 | 226 | 0.89 |
| 184 | 220 | 0.87 |
| 204 | 217 | 0.86 |
| 223 | 214 | 0.85 |
| 267 | 200 | 0.79 |
| 305 | 185 | 0.73 |
| 344 | 148 | 0.58 |
| 382 | 124 | 0.49 |
| 422 | 86 | 0.34 |
| 461 | 40 | 0.16 |
| 481 | 24 | 0.09 |
| 501 | 2 | 0.01 |

Table 6 to Table 12 indicate that the exchange coupling film according to each of the examples generates the exchange-coupled magnetic field Hex with strength of 2 times or more the exchange coupling magnetic films according to the comparative examples. Also, FIG. 14 shows the tendency that the exchange-coupled magnetic field Hex decreases as the environmental temperature increases. However, in the exchange coupling films according to the examples, the exchange-coupled magnetic field Hex tends to be slowly decreased, resulting in the blocking temperature Tb of 400° C. or more. While, in the exchange coupling films according to the comparative examples, the exchange-coupled magnetic field Hex is easily decreased, resulting in the blocking temperature Tb of about 300° C. These results indicate that the TMR device having the exchange coupling film according to the present invention has excellent heat resistance.

Example 11

A laminate having a film configuration shown in Table 13 was produced.

TABLE 13

| Component | | Composition | Thickness (Å) |
|---|---|---|---|
| Upper electrode E2 | | Ru | 70 |
| | | Ta | 100 |
| | | Ru | 50 |
| Antiferromagnetic layer 2 | PtCr layer 2B | 50PtCr | 300 |
| | PtMn layer 2A | PtMn | 14 |
| | IrMn layer 2C | IrMn | 8 |
| Fixed layer 3 | First ferromagnetic layer 31 | 60FeCo | 24 |
| | Nonmagnetic intermediate layer 32 | Ru | 8 |
| | Second ferromagnetic layer 33 | 90CoFe | 20 |
| | Anti-diffusion layer 3X | Ta | 3 |
| | Ferromagnetic layer 3A | (50CoFe)B30 | 5 |
| | | 50FeCo | 10 |
| Insulating barrier layer 4 | | MgO | 20 |
| Free magnetic layer 5 | | 50FeCo | 10 |
| | | (50CoFe)B30 | 30 |
| Lower electrode E1 | | Ta | 150 |
| | | Cu | 200 |
| | | Ta | 30 |
| | | Cu | 200 |
| | | Ta | 30 |
| Alumina | | | 0.1 μm |
| Si substrate | | | 0.5 mm |

A TMR device 11D was produced by annealing heat treatment of the resultant laminate at 350° C. for 10 hours in a magnetic field environment of 15 kOe.

Example 12

A laminate having a film configuration shown in Table 14 was produced.

TABLE 14

| Component | | Composition | Thickness (Å) |
|---|---|---|---|
| Upper electrode E2 | | Ru | 70 |
| | | Ta | 100 |
| | | Ru | 50 |
| Antiferromagnetic layer 2 | PtCr layer 2B | 50PtCr | 300 |
| | PtMn layer 2A | PtMn | 14 |
| | IrMn layer 2C | IrMn | 8 |
| Fixed layer 3 | First ferromagnetic layer 31 | 60FeCo | 24 |
| | Nonmagnetic intermediate layer 32 | Ru | 8 |
| | Second ferromagnetic layer 33 | 90CoFe | 20 |
| | Anti-diffusion layer 3X | Ta | 3 |
| | Ferromagnetic layer 3A | (50CoFe)B30 | 10 |
| | | 50FeCo | 10 |
| Insulating barrier layer 4 | | MgO | 20 |
| Free magnetic layer 5 | | 50FeCo | 10 |
| | | (50CoFe)B30 | 30 |
| Lower electrode E1 | | Ta | 150 |
| | | Cu | 200 |
| | | Ta | 30 |
| | | Cu | 200 |

TABLE 14-continued

| Component | Composition | Thickness (Å) |
|---|---|---|
| | Ta | 30 |
| Alumina | | 0.1 μm |
| Si substrate | | 0.5 mm |

A TMR device 11D was produced by annealing heat treatment of the resultant laminate at 350° C. for 10 hours in a magnetic field environment of 15 kOe.

Example 13

A laminate having a film configuration shown in Table 15 was produced.

TABLE 15

| Component | | Composition | Thickness (Å) |
|---|---|---|---|
| Upper electrode E2 | | Ru | 70 |
| | | Ta | 100 |
| | | Ru | 50 |
| Antiferromagnetic layer 2 | PtCr layer 2B | 50PtCr | 300 |
| | PtMn layer 2A | PtMn | 14 |
| | IrMn layer 2C | IrMn | 8 |
| Fixed layer 3 | First ferromagnetic layer 31 | 60FeCo | 24 |
| | Nonmagnetic intermediate layer 32 | Ru | 8 |
| | Second ferromagnetic layer 33 | 90CoFe | 20 |
| | | (50CoFe)B30 | 5 |
| | | 50FeCo | 10 |
| Insulating barrier layer 4 | | MgO | 20 |
| Free magnetic layer 5 | | 50FeCo | 10 |
| | | (50CoFe)B30 | 30 |
| Lower electrode E1 | | Ta | 150 |
| | | Cu | 200 |
| | | Ta | 30 |
| | | Cu | 200 |
| | | Ta | 30 |
| Alumina | | | 0.1 μm |
| Si substrate | | | 0.5 mm |

A TMR device 11B was produced by annealing heat treatment of the resultant laminate at 350° C. for 10 hours in a magnetic field environment of 15 kOe.

Example 14

A laminate having a film configuration shown in Table 16 was produced.

TABLE 16

| Component | | Composition | Thickness (Å) |
|---|---|---|---|
| Upper electrode E2 | | Ru | 70 |
| | | Ta | 100 |
| | | Ru | 50 |
| Antiferromagnetic layer 2 | PtCr layer 2B | 50PtCr | 300 |
| | PtMn layer 2A | PtMn | 14 |
| | IrMn layer 2C | IrMn | 8 |
| Fixed layer 3 | First ferromagnetic layer 31 | 60FeCo | 24 |
| | Nonmagnetic intermediate layer 32 | Ru | 8 |
| | Second ferromagnetic layer 33 | 90CoFe | 20 |
| | | 50FeCo | 10 |
| Insulating barrier layer 4 | | MgO | 20 |
| Free magnetic layer 5 | | 50FeCo | 10 |
| | | (50CoFe)B30 | 30 |
| Lower electrode E1 | | Ta | 150 |

TABLE 16-continued

| Component | Composition | Thickness (Å) |
|---|---|---|
| | Cu | 200 |
| | Ta | 30 |
| | Cu | 200 |
| | Ta | 30 |
| Alumina | | 0.1 μm |
| Si substrate | | 0.5 mm |

A TMR device 11B was produced by annealing heat treatment of the resultant laminate at 350° C. for 10 hours in a magnetic field environment of 15 kOe.

Cooperative Example 11

A laminate having a film configuration shown in Table 17 was produced.

TABLE 17

| Component | | Composition | Thickness (Å) |
|---|---|---|---|
| Upper electrode E2 | | Ru | 70 |
| | | Ta | 100 |
| | | Ru | 50 |
| Antiferromagnetic layer 2 | | IrMn | 80 |
| Fixed layer 3 | First ferromagnetic layer 31 | 60FeCo | 24 |
| | Nonmagnetic intermediate layer 32 | Ru | 8 |
| | Second ferromagnetic layer 33 | 90CoFe | 20 |
| | | 50FeCo | 10 |
| Insulating barrier layer 4 | | MgO | 20 |
| Free magnetic layer 5 | | 50FeCo | 10 |
| | | (50CoFe)B30 | 30 |
| Lower electrode E1 | | Ta | 150 |
| | | Cu | 200 |
| | | Ta | 30 |
| | | Cu | 200 |
| | | Ta | 30 |
| Alumina | | | 0.1 μm |
| Si substrate | | | 0.5 mm |

A TMR device 11B was produced by annealing heat treatment of the resultant laminate at 350° C. for 10 hours in a magnetic field environment of 15 kOe.

The resistance change rate ΔMR (unit: %) was measured for each of the TMR devices according to Example 1-1, Example 1-2, Comparative Example 1-1, Comparative Example 1-2, Example 11 to Example 13, and Comparative Example 1. The results are shown in Table 18.

TABLE 18

| | ΔMR (%) |
|---|---|
| Example 1-4 | 64 |
| Example 2-4 | 268 |
| Comparative Example 1-4 | 21 |
| Comparative Example 2-4 | 208 |
| Example 11 | 274 |
| Example 12 | 271 |
| Example 13 | 123 |
| Example 14 | 92 |
| Comparative Example 11 | 34 |

As shown in Table 18, it was confirmed that in the TMR devices 11D and 11B according to Example 11 to Example 14, the high resistance change rate ΔMR can be obtained even in a so-called top type including the fixed magnetic layer 3 formed on the insulating barrier layer 4, like in a so-called bottom type including the fixed magnetic layer 3 formed below the insulating barrier layer 4 as in the TMR devices 11A and 11C according to Example 1-4 and Example 2-4.

What is claimed is:

1. A tunnel magnetoresistance effect device comprising:
a structure comprising a fixed magnetic layer having a ferromagnetic layer and a free magnetic layer that is laminated through an insulating barrier layer, wherein:
the ferromagnetic layer and an antiferromagnetic layer laminated on the ferromagnetic layer constitute an exchange coupling film;
the antiferromagnetic layer includes an X(Cr—Mn) layer containing one or two or more elements X selected from the group consisting of the platinum group elements and Ni, and also containing Mn and Cr;
the X(Cr—Mn) layer has a first region relatively near the ferromagnetic layer, and a second region relatively far away from the ferromagnetic layer; and
the content of Mn in the first region is higher than that in the second region;
wherein in the exchange-coupling film, a normalized exchange-coupling magnetic field obtained by dividing an exchange-coupling magnetic field measured at 422° C. by an exchange-coupling magnetic field measured at 22° C. is 0.34 or greater.

2. The tunnel magnetoresistance effect device according to claim 1, wherein the first region is in contact with the ferromagnetic layer.

3. The tunnel magnetoresistance effect device according to claim 1, wherein the first region has a portion having a Mn/Cr ratio of 0.3 or more, which is the ratio of the Mn content to the Cr content.

4. The tunnel magnetoresistance effect device according to claim 3, wherein the first region has a portion having the Mn/Cr ratio of 1 or more.

5. The tunnel magnetoresistance effect device according to claim 1, wherein the antiferromagnetic layer comprises a laminate of a PtCr layer and an X0Mn Layer (wherein X0 is one or two or more elements selected from the group consisting of the platinum group elements and Ni) nearer to the ferromagnetic layer than the PtCr layer.

6. The tunnel magnetoresistance effect device according to claim 1, wherein the antiferromagnetic layer comprises a laminate of a PtCr layer and a PtMn layer in this order so that the PtMn layer is nearer to the ferromagnetic layer.

7. The tunnel magnetoresistance effect device according to claim 6, wherein an IrMn layer is further laminated nearer to the ferromagnetic layer than the PtMn layer.

8. The tunnel magnetoresistance effect device according to claim 1, wherein the tunnel magnetoresistance effect device is disposed on a substrate; and
the fixed magnetic layer is laminated nearer to the substrate than the free magnetic layer.

9. The tunnel magnetoresistance effect device according to claim 1, wherein the tunnel magnetoresistance effect device is disposed on a substrate; and
the fixed magnetic layer is laminated farther away from the substrate than the free magnetic layer.

10. A tunnel magnetoresistance effect device comprising:
a structure comprising a fixed magnetic layer having a ferromagnetic layer and a free magnetic layer that is laminated through an insulating barrier layer, wherein:
the ferromagnetic layer and an antiferromagnetic layer laminated on the ferromagnetic layer constitute an exchange coupling film; and the antiferromagnetic layer has an alternately laminated structure of three or more layers in which an X1Cr layer (wherein X1 is one or two or more elements selected from the group consisting of the platinum group elements and Ni) and an X2Mn layer (wherein X2 is one or two or more elements selected from the group consisting of the platinum group elements and Ni and may be the same as or different from X1) are alternately laminated.

11. The tunnel magnetoresistance effect device according to claim 10, wherein X1 is Pt, and X2 is Pt or Ir.

12. The tunnel magnetoresistance effect device according to claim 10, wherein the antiferromagnetic layer has a unit laminated portion in which a plurality of units each including the X1Cr layer and the X2Mn layer are laminated.

13. The tunnel magnetoresistance effect device according to claim 12, wherein in the unit laminated portion, the X1Cr layers have the same thickness and the X2Mn layers have the same thickness, and the thickness of X1Cr layers is larger than the thickness of the X2Mn layers.

14. The tunnel magnetoresistance effect device according to claim 13, wherein the ratio of the thickness of the X1Cr layer to the thickness of the X2Mn layer is 5:1 to 100:1.

15. The tunnel magnetoresistance effect device according to claim 10, wherein the tunnel magnetoresistance effect device is disposed on a substrate; and
the fixed magnetic layer is laminated to be nearer to the substrate than the free magnetic layer.

16. The tunnel magnetoresistance effect device according to claim 10, wherein the tunnel magnetoresistance effect device is disposed on a substrate; and
the fixed magnetic layer is laminated farther away from the substrate than the free magnetic layer.

17. A magnetic device comprising:
a tunnel magnetoresistance effect device; wherein
the tunnel magnetoresistance effect device comprises:
a structure comprising a fixed magnetic layer having a ferromagnetic layer and a free magnetic layer that is laminated through an insulating barrier layer, wherein:
the ferromagnetic layer and an antiferromagnetic layer laminated on the ferromagnetic layer constitute an exchange coupling film;
the antiferromagnetic layer has an alternately laminated structure of three or more layers in which an X1Cr layer (wherein X1 is one or two or more elements selected from the group consisting of the platinum group elements and Ni) and an X2Mn layer (wherein X2 is one or two or more elements selected from the group consisting of the platinum group elements and Ni and may be the same as or different from X1) are alternately laminated;
the X(Cr—Mn) layer has a first region relatively near the ferromagnetic layer, and a second region relatively far away from the ferromagnetic layer; and
the content of Mn in the first region is higher than that in the second region;
wherein:
the antiferromagnetic layer has a unit laminated portion in which a plurality of units each including the X1Cr layer and the X2Mn layer are laminated; and
in the unit laminated portion, the X1Cr layers have the same thickness and the X2Mn layers have the same thickness, and the thickness of X1Cr layers is larger than the thickness of the X2Mn layers.

18. The magnetic device according to claim 17, comprising a magnetic head including the tunnel magnetoresistance effect device as a reading device.

19. The magnetic device according to claim 17, comprising a magnetic memory including the tunnel magnetoresistance effect device as a recording device.

20. The magnetic device according to claim 17, comprising a magnetic sensor having the tunnel magnetoresistance effect device as a detection device.

21. An apparatus comprising:
a magnetic device wherein the magnetic device comprises:
a tunnel magnetoresistance effect device comprising:
a structure comprising a fixed magnetic layer having a ferromagnetic layer and a free magnetic layer that is laminated through an insulating barrier layer, wherein:
the ferromagnetic layer and an antiferromagnetic layer laminated on the ferromagnetic layer constitute an exchange coupling film;
the antiferromagnetic layer includes an X(Cr—Mn) layer containing one or two or more elements X selected from the group consisting of the platinum group elements and Ni, and also containing Mn and Cr;
the X(Cr—Mn) layer has a first region relatively near the ferromagnetic layer, and a second region relatively far away from the ferromagnetic layer; and
the content of Mn in the first region is higher than that in the second region;
wherein:
the tunnel magnetoresistance effect device is disposed on a substrate; and
the fixed magnetic layer is laminated farther away from the substrate than the free magnetic layer.

* * * * *